US009514539B2

(12) United States Patent
Rivet-Sabourin

(10) Patent No.: US 9,514,539 B2
(45) Date of Patent: Dec. 6, 2016

(54) SEGMENTATION OF MAGNETIC RESONANCE IMAGING DATA

(71) Applicant: LABORATOIRES BODYCAD INC., Quebec (CA)

(72) Inventor: Geoffroy Rivet-Sabourin, Stoneham (CA)

(73) Assignee: LABORATOIRES BODYCAD INC., Québec (CA)

( * ) Notice: Subject to any disclaimer, the term of this patent is extended or adjusted under 35 U.S.C. 154(b) by 76 days.

(21) Appl. No.: 14/399,796

(22) PCT Filed: May 9, 2013

(86) PCT No.: PCT/CA2013/000463
§ 371 (c)(1),
(2) Date: Nov. 7, 2014

(87) PCT Pub. No.: WO2013/166592
PCT Pub. Date: Nov. 14, 2013

(65) Prior Publication Data
US 2015/0302601 A1    Oct. 22, 2015

Related U.S. Application Data

(60) Provisional application No. 61/644,518, filed on May 9, 2012.

(51) Int. Cl.
*G06T 7/00* (2006.01)
*G01R 33/56* (2006.01)
(Continued)

(52) U.S. Cl.
CPC ......... *G06T 7/0083* (2013.01); *G01R 33/5608* (2013.01); *G06T 7/0089* (2013.01);
(Continued)

(58) Field of Classification Search
None
See application file for complete search history.

(56) References Cited

U.S. PATENT DOCUMENTS 5,790,692 A   8/1998 Price et al.
5,797,396 A   8/1998 Geiser et al.
(Continued)

FOREIGN PATENT DOCUMENTS

WO   WO-03/041584 A2   5/2003

OTHER PUBLICATIONS

Cohen, Laurent D. "On active contour models and balloons." CVGIP: Image understanding 53.2 (1991): 211-218.*
(Continued)

*Primary Examiner* — Vikkram Bali
*Assistant Examiner* — Tracy Mangialaschi
(74) *Attorney, Agent, or Firm* — Marshall, Gerstein & Borun LLP

(57) ABSTRACT

There is described herein an image segmentation technique using an iterative process. A contour, which begins with a single point that expands into a hollow shape, is iteratively deformed into a defined structure. As the contour is deformed, various constraints are applied to points along the contour to dictate its rate of change and direction of change are modified dynamically. The constraints may be modified after one or more iterations, at each point along the contour, in accordance with newly measured or determined data.

19 Claims, 20 Drawing Sheets

(51) Int. Cl.
*G06T 17/20* (2006.01)
*G06T 19/20* (2011.01)
(52) U.S. Cl.
CPC ............ *G06T 7/0091* (2013.01); *G06T 17/20* (2013.01); *G06T 19/20* (2013.01); *G06T 2207/10088* (2013.01); *G06T 2207/20116* (2013.01); *G06T 2207/30008* (2013.01)

(56) References Cited

U.S. PATENT DOCUMENTS

| | | | |
|---|---|---|---|
| 6,078,680 | A | 6/2000 | Yoshida et al. |
| 6,980,682 | B1 | 12/2005 | Avinash et al. |
| 7,043,290 | B2 | 5/2006 | Young et al. |
| 7,587,073 | B2 | 9/2009 | Park |
| 7,925,064 | B2 | 4/2011 | Cloutier et al. |
| 7,929,739 | B2 | 4/2011 | Li |
| 7,953,266 | B2 | 5/2011 | Gulsun et al. |
| 8,031,919 | B2 | 10/2011 | Eskildsen et al. |
| 8,253,802 | B1 | 8/2012 | Anderson et al. |
| 8,401,305 | B2 | 3/2013 | Kido |
| 8,406,527 | B2 | 3/2013 | Kido |
| 8,515,171 | B2 | 8/2013 | Vantaram et al. |
| 2004/0010375 | A1 | 1/2004 | Schomacker et al. |
| 2005/0111732 | A1 | 5/2005 | Mallya et al. |
| 2005/0113679 | A1 | 5/2005 | Suryanarayanan et al. |
| 2006/0013482 | A1* | 1/2006 | Dawant ............... G06T 7/0083 382/173 |
| 2006/0222226 | A1 | 10/2006 | Xia et al. |
| 2007/0086640 | A1 | 4/2007 | Luo et al. |
| 2008/0044072 | A1 | 2/2008 | Kiraly et al. |
| 2008/0112617 | A1 | 5/2008 | Slabaugh et al. |
| 2008/0171932 | A1* | 7/2008 | Yan ...................... A61B 5/055 600/410 |
| 2009/0185746 | A1 | 7/2009 | Mian et al. |
| 2009/0190815 | A1 | 7/2009 | Dam et al. |
| 2009/0220138 | A1 | 9/2009 | Zhang et al. |
| 2010/0008576 | A1 | 1/2010 | Piramuthu |
| 2010/0153081 | A1 | 6/2010 | Bellettre et al. |
| 2011/0075927 | A1 | 3/2011 | Xu et al. |
| 2011/0081056 | A1 | 4/2011 | Salafia |
| 2011/0110567 | A1 | 5/2011 | Jiang |
| 2011/0123090 | A1 | 5/2011 | Zerfass et al. |

OTHER PUBLICATIONS

Archip, Neculai, et al. "Anatomical structure modeling from medical images." Computer Methods and Programs in Biomedicine 82.3 (2006): 203-215.*

Cohen, Laurent D., and Isaac Cohen. "Finite-element methods for active contour models and balloons for 2-D and 3-D images." IEEE Transactions on Pattern Analysis and machine intelligence 15.11 (1993): 1131-1147.*

Lorigo, Liana M., et al. "Segmentation of bone in clinical knee MRI using texture-based geodesic active contours." International Conference on Medical Image Computing and Computer-Assisted Intervention. Springer Berlin Heidelberg, 1998.*

International Preliminary Report on Patentability, corresponding International Application No. PCT/CA2013/000463, dated Jul. 11, 2014.

International Search Report, corresponding International Application No. PCT/CA2013/000463, dated Aug. 15, 2013.

Pohle et al., "Segmentation of medical images using adaptive region growing", SPIE Proceedings, vol. 4322, Medical Imaging 2001: Image Processing, 1337, dated Jul. 3, 2001.

Mao et al., "Color image segmentation method based on region growing and ant colony clustering", WRI Global Congress on Intelligent Systems, pp. 173-177, dated May, 2009.

Tilton, J.C., "Image segmentation by region growing and spectral clustering with a neural convergence criterion", Proceedings of the 1998 Geoscience and remote sensing symposium (IGARSS . '98), dated Jul. 1998.

Yang, "An image analysis system for measuring shape and motion of white blood cells from a sequence of fluorescence microscopy images", University of Oslo, Master Thesis, 1994, 128p.

Extended European Search Report issued in European Patent Application No. 13786941 dated Aug. 18, 2016.

Schnabel, Julia A. et al, "Active Shape Focusing," *Image and Vision Computing*; 17.5 (1999); pp. 419-428.

Papari, G. et al., "A Biologically Motivated Multiresolution Approach to Contour Detection," *EURASIP Journal on Applied Signal Processing*, (2007), 28 pages.

* cited by examiner

SEGMENTATION OF MAGNETIC RESONANCE IMAGING DATA

CROSS-REFERENCE TO RELATED APPLICATIONS

This application claims priority under 35 USC §119(e) of U.S. Provisional Patent Application No. 61/644,518 filed on May 9, 2012, the contents of which are hereby incorporated by reference.

TECHNICAL FIELD

The present invention relates to the field of image segmentation, and more particularly, to the segmentation of MRI data as received from an MRI apparatus.

BACKGROUND OF THE ART

Computer production of images from magnetic resonance has become an invaluable tool in medicine as the structural and biochemical information that can be obtained is helpful in the diagnosis of abnormalities without the possibly harmful effects of x-rays or gamma rays. Magnetic Resonance Imaging (MRI) provides better contrast between normal and diseased tissue than those produced by other computer-assisted imagery.

The final image product of an MRI must first go through a process of segmentation, which refers to the partitioning of a digital image into multiple segments in order to provide an image that is more meaningful or easier to analyze. Objects and boundaries in the image, such as lines, curves, and others, are located and enhanced using shared pixel characteristics, such as color, intensity, or texture. Bones, cartilage, ligaments, and other soft tissues of the body thus become identifiable by the trained eye.

While there exists many different techniques for segmenting MRI images, the quality of the output is only as good as the processing methods. There is therefore a need to improve on existing processing methods in order to provide a better output.

SUMMARY

There is described herein an image segmentation technique using an iterative process. A contour, which begins with a single point that expands into a hollow shape, is iteratively deformed into a defined structure. As the contour is deformed, various constraints applied to points along the contour to dictate its rate of change and direction of change are modified dynamically. The constraints may be modified after one or more iterations, at each point along the contour, in accordance with newly measured or determined data.

In accordance with a first broad aspect, there is described a computer-implemented method for segmenting magnetic resonance imaging (MRI) data, the method comprising: determining an initial position on an image for a given structure; converting the initial position into an initial contour within the given structure; and iteratively deforming the initial contour to expand into a shape matching the given structure by dynamically applying a set of constraints locally to each point along the initial contour and updating the set of constraints after one or more iterations.

In accordance with a second broad aspect, there is described a system for generating segmented data from magnetic resonance imaging (MRI) data, the system comprising: at least one computer server communicable with at least one computing device over a network, the at least one computer server having a processor and a memory; an initial position module stored on the memory and executable by the processor, the initial position module having program code that when executed, determines an initial position on an image for a given structure and converting the initial position into an initial contour; and a contour definition module stored on the memory and executable by the processor, the contour definition module having program code that when executed, iteratively deforms the initial contour to expand into a shape matching the given structure by dynamically applying a set of constraints locally to each point along the initial contour and updating the set of constraints after one or more iterations.

In accordance with a third broad aspect, there is described a computer readable medium having stored thereon program code executable by a processor for generating segmented data from magnetic resonance imaging (MRI) data, the program code executable for: determining an initial position on an image for a given structure; converting the initial position into an initial contour within the given structure; and iteratively deforming the initial contour to expand into a shape matching the given structure by dynamically applying a set of constraints locally to each point along the initial contour and updating the set of constraints after one or more iterations.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION

Figure 1:
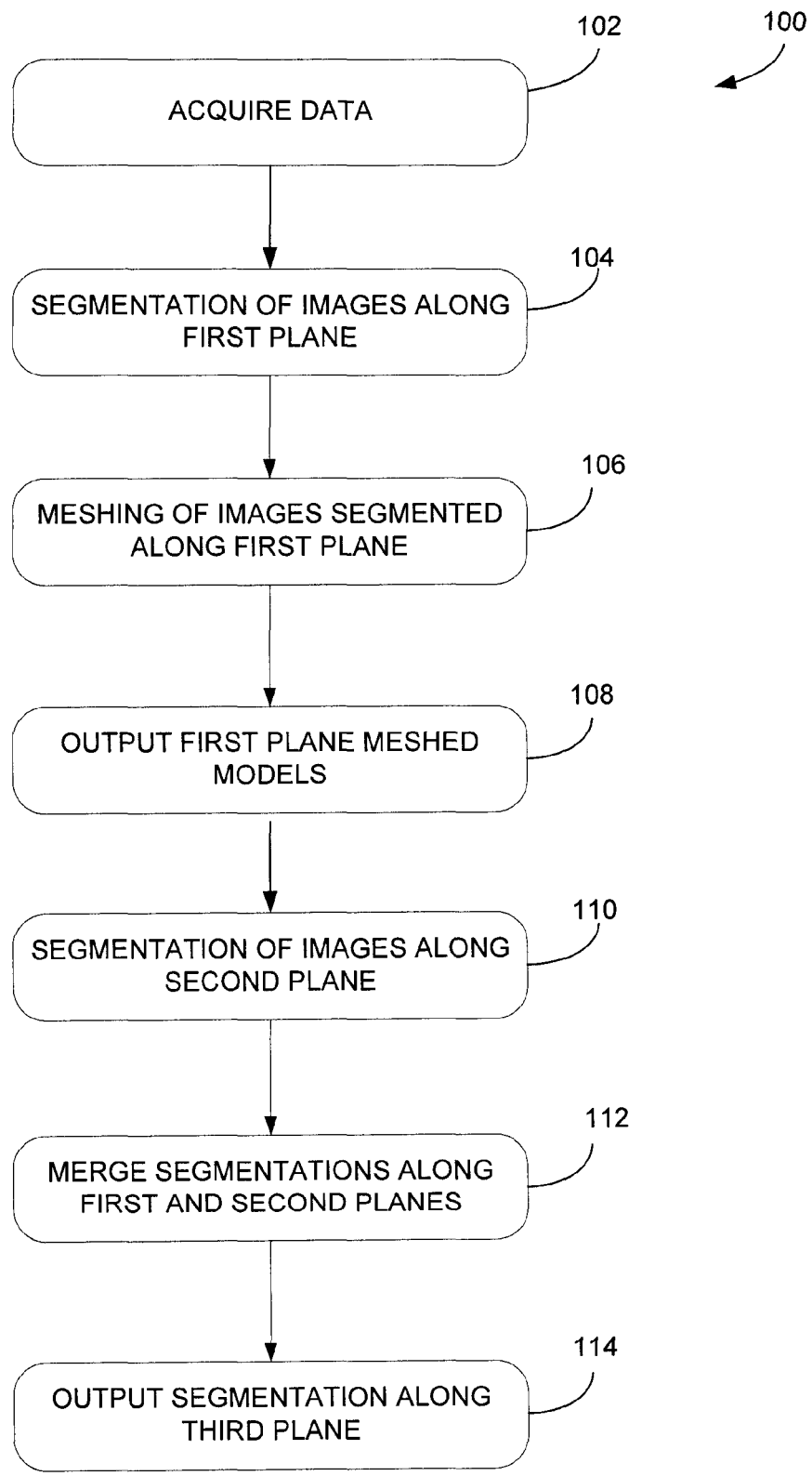
FIG. 1 is a flowchart illustrating an exemplary method for segmenting MRI data.

Referring to FIG. 1, there is described a high level process 100 for providing images using MRI. The broad steps of data acquisition 102, image segmentation along a first plane (or direction) 104, meshing of images segmented along the first plane 106, outputting of meshed images along the first plane 108, image segmentation along a second plane (or direction) 110, merging of segmentations along the first and second planes 112 to create a single structure in the image, and outputting images segmented along a third plane (or direction) are illustrated. Data acquisition 102 refers to the acquisition of MRI data using an imaging apparatus based on magnetic resonance. A magnetic field aligns the magnetization of atomic nuclei in the body, and radio frequency fields systematically alter the alignment of this magnetization. This causes the nuclei to produce a rotating magnetic field detectable by a scanner. The scanner records the information and constructs an image of the scanned area of the body. The images are recorded as a series of slices as a volume is scanned, with scanning settings determining the thickness of each slice and the spacing between slices. A 3D sequence, often used to image bones, corresponds to having no or negligible spacing between the slices.

When a technician or operator manipulates the apparatus in order to acquire data 102, a virtual box may be defined around a part of the body targeted for imaging. A sequence may be selected from a plurality of available sequences in order to correspond with a desired output. The apparatus is then activated and the data is acquired in an automated fashion.

The data acquisition 102 may be done along one or more planes or directions throughout the body part, such as sagittal, coronal, and transverse. In some embodiments, multiple orientations are performed and the data may be combined or merged during the processing phase. For example, a base set of images may be prepared on the basis of data acquired along a first plane, such as the sagittal plane, with missing information being provided using data acquired along a second plane, such as the coronal plane. It should be understood that, although the coronal plane is discussed herein as being the second plane, the transverse plane or any other suitable plane may also be used as the second plane. Other combinations or techniques to optimize the use of data along more than one orientation will be readily understood by those skilled in the art. In some embodiments, a volume of data is obtained using a 3D acquisition sequence independent of an axis of acquisition. The volume of data may be sliced in any direction as desired.

The data may be acquired using any known magnetic resonance imaging techniques and any known devices for acquiring such data. The acquired data may be provided in various known formats and using various known protocols, such as Digital Imaging and Communications in Medicine (DICOM), for handling, storing, printing, and transmitting information. Other exemplary formats are GE SIGNA Horizon LX, Siemens Magnatom Vision, SMIS MRD/SUR, and GE MR SIGNA 3/5 formats.

Step 102 may also comprise acquiring data from a parameter file, which illustratively comprises a set of parameters to be taken into account and/or used as input when implementing the process 100. For instance, the parameter file may comprise data indicative of a minimal allowable size for holes between edges present in the image(s). As known to those skilled in the art, the edges may correspond to sudden transitions in the image gradient and may represent boundaries of objects or material properties. The parameter file may also comprise data defining contour curvature constraints. It should be understood that the parameter file may comprise other data and/or parameters and that the latter may or may not be specific to an individual, e.g. a patient, whose body is being imaged using the process 100. Indeed, in one embodiment, the data contained in the parameter file may be static throughout the process 100. In other embodiments where the parameter file is specific to an individual, the parameter file may be modified to be tailored to the individual in question.

Figure 2:
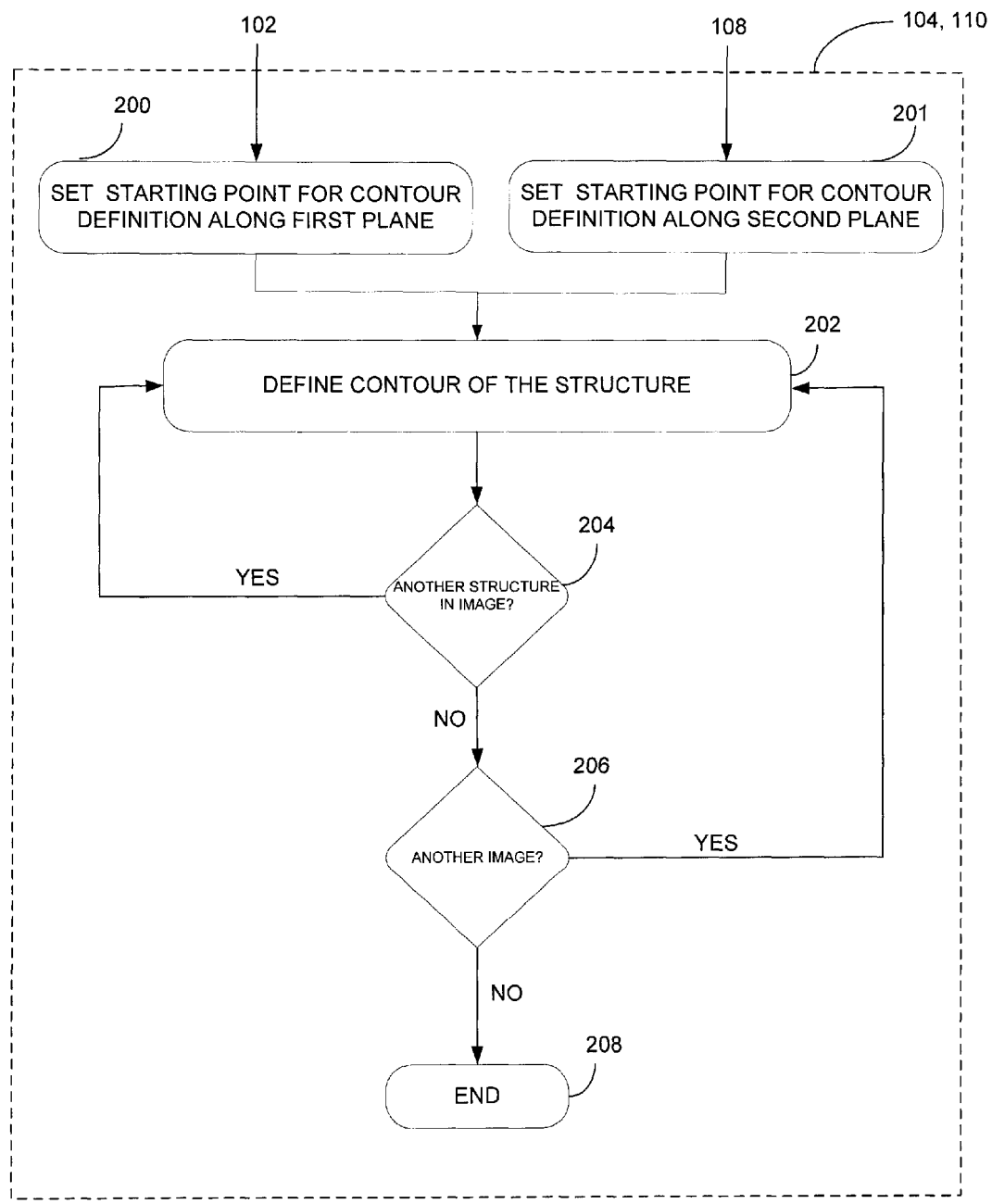
FIG. 2 is a flowchart illustrating an exemplary embodiment for segmenting images.

Once acquired, the images are segmented 104 along a first plane, e.g. the sagittal plane, in order to identify the different structures in each slice. FIG. 2 illustrates an exemplary method for segmenting the acquired images 104. Step 200 consists in determining a starting point for contour definition of a given structure in a set of images along the first plane. As will be discussed further below, a step 201 of determining a starting point for contour definition of a given structure in a set of images taken along the second plane, e.g. the coronal plane, is also implemented when segmenting (at step 110, discussed further below) images along the second plane. In some embodiments, the starting point set at step 200 may be a single point. The initial contour may then be four neighboring points (or pixels) around the single point. From the starting point, contour definition of a structure 202 is performed for a given slice. When more than one structure is present in a given slice (or image) 204, the step of performing contour definition 202 is repeated until all structures have been defined. Contour definition of a structure 202 may be performed on all subsequent images in the data set 206. Once all images have been processed, segmentation is complete 208.

In one embodiment, the images (or slices) are processed sequentially, one at a time. In alternative embodiments, the images may be processed in parallel. For example, in one alternative embodiment, a first center slice is processed and the images from the center slice to the first slice are processed in parallel with the images from the center slice to the last slice. In a set of 100 exemplary slices, slice 50 is processed initially in accordance with steps 200 to 204 of the segmentation process 104. Slices 49 and 51 are then processed in parallel, followed by slices 48 and 52, followed by slices 47 and 53, etc, until slices 1 and 100 are processed. In another alternative embodiment, the set of 100 exemplary slices are separated into five groups of 20 slices and each set of 20 slices is processed in parallel. In yet another alternative embodiment, all even-numbered slices from the set of 100 exemplary slices are processed together, in parallel, followed by all of the odd-numbered slices. Parallel processing during segmentation reduces the overall time required to generate segmented images. It also prevents errors from being propagated throughout the set of slices, should there be errors introduced during any of the step of defining contours of the structures 202 in each image. When performing step 200, slices need to be processed sequentially, however smaller blocs of sequential slices may be processed in parallel. When performing step 202, the order of the slices has no impact on the result.

Figure 3A:
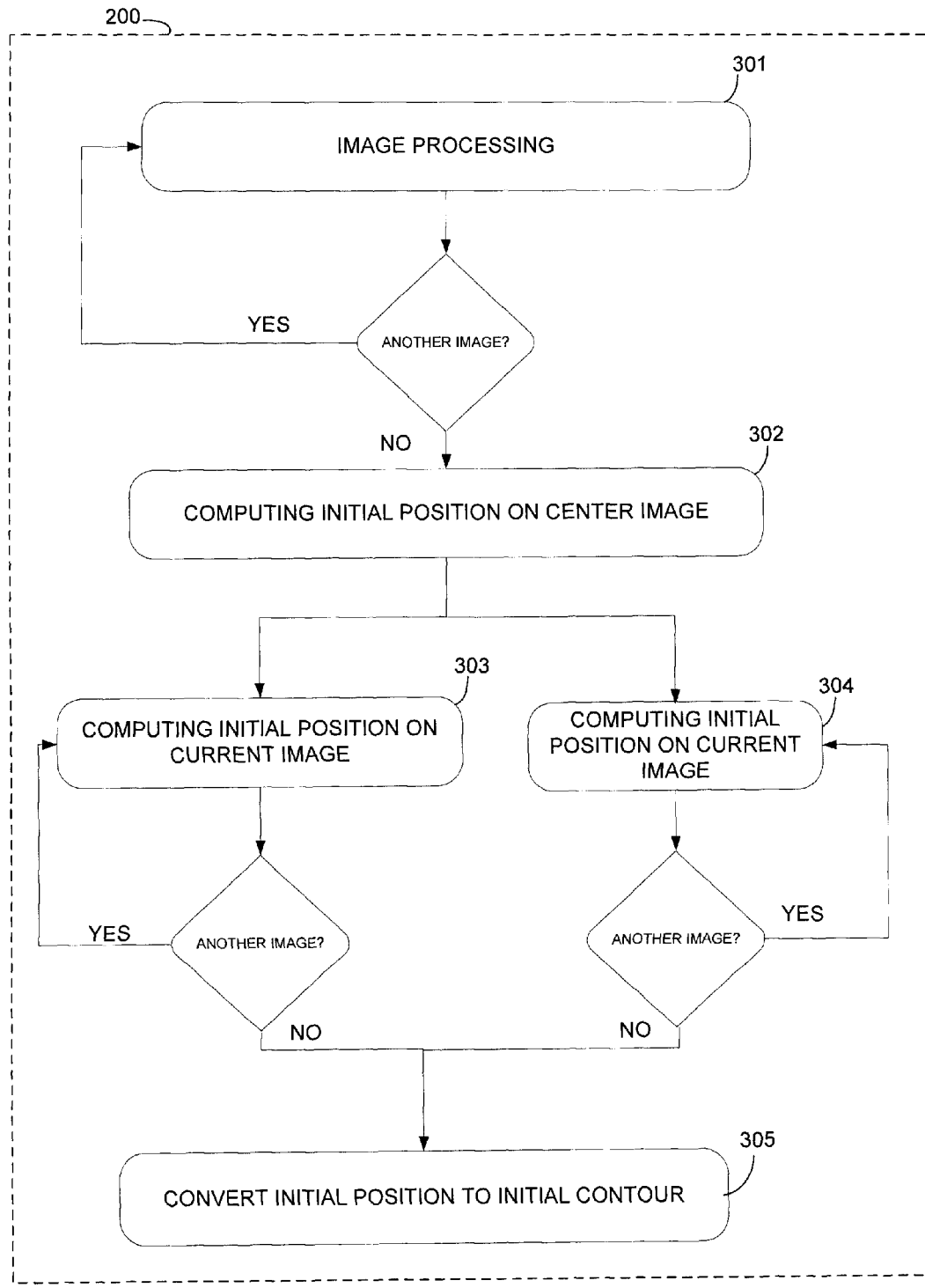
FIGS. 3a and 3b are flowcharts illustrating an exemplary embodiment for setting a starting point for contour definition along a first plane when segmenting an image.
Figure 3B:
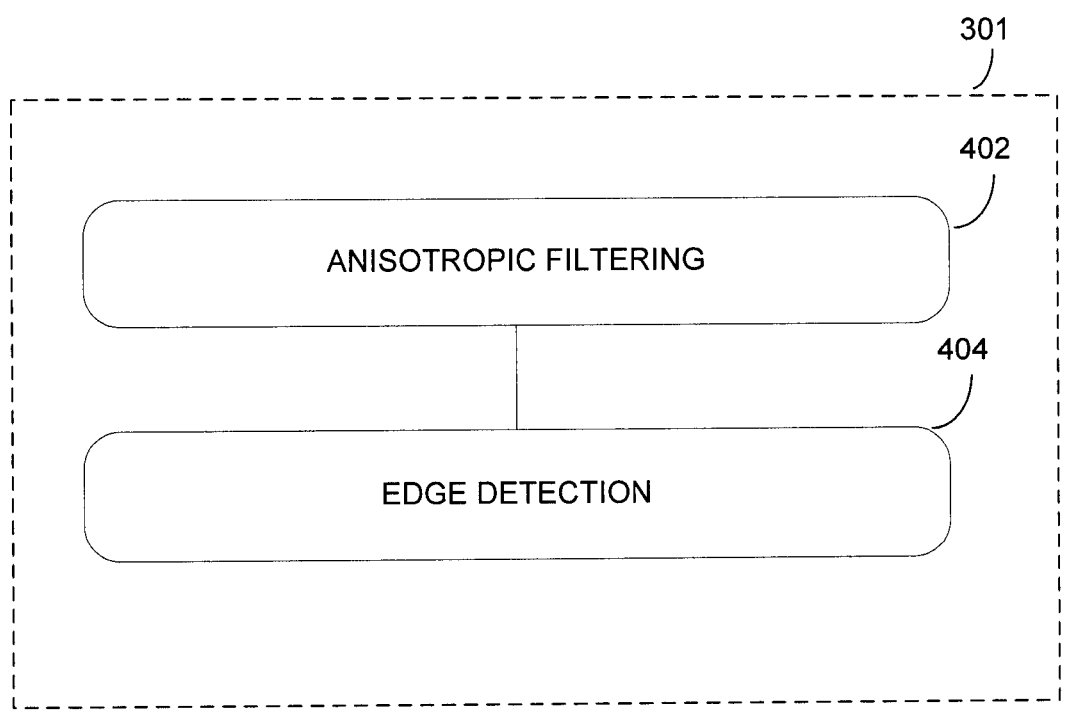

In the embodiment illustrated in FIG. 2, the starting points for contour definition of all of the structures in a given slice are calculated before proceeding to the step 202 of defining the structure contours. Referring now to FIG. 3a, there is illustrated an exemplary embodiment for determining 200 a starting point for contour definition of a structure in a set of images along the first plane. The method generally comprises some image processing steps 301, followed by the computation of an initial position on the center image 302, and followed by the parallel computation of an initial position on a current image of a first half of the slices 303 and a current image of a second half of the slices 304. The initial position is converted to an initial contour 305. FIG. 3b is an exemplary embodiment for the image processing steps 301, whereby anisotropic filtering 402 and edge detection 404 are performed on the images before computing the initial position on the center image 302.

Figure 4:
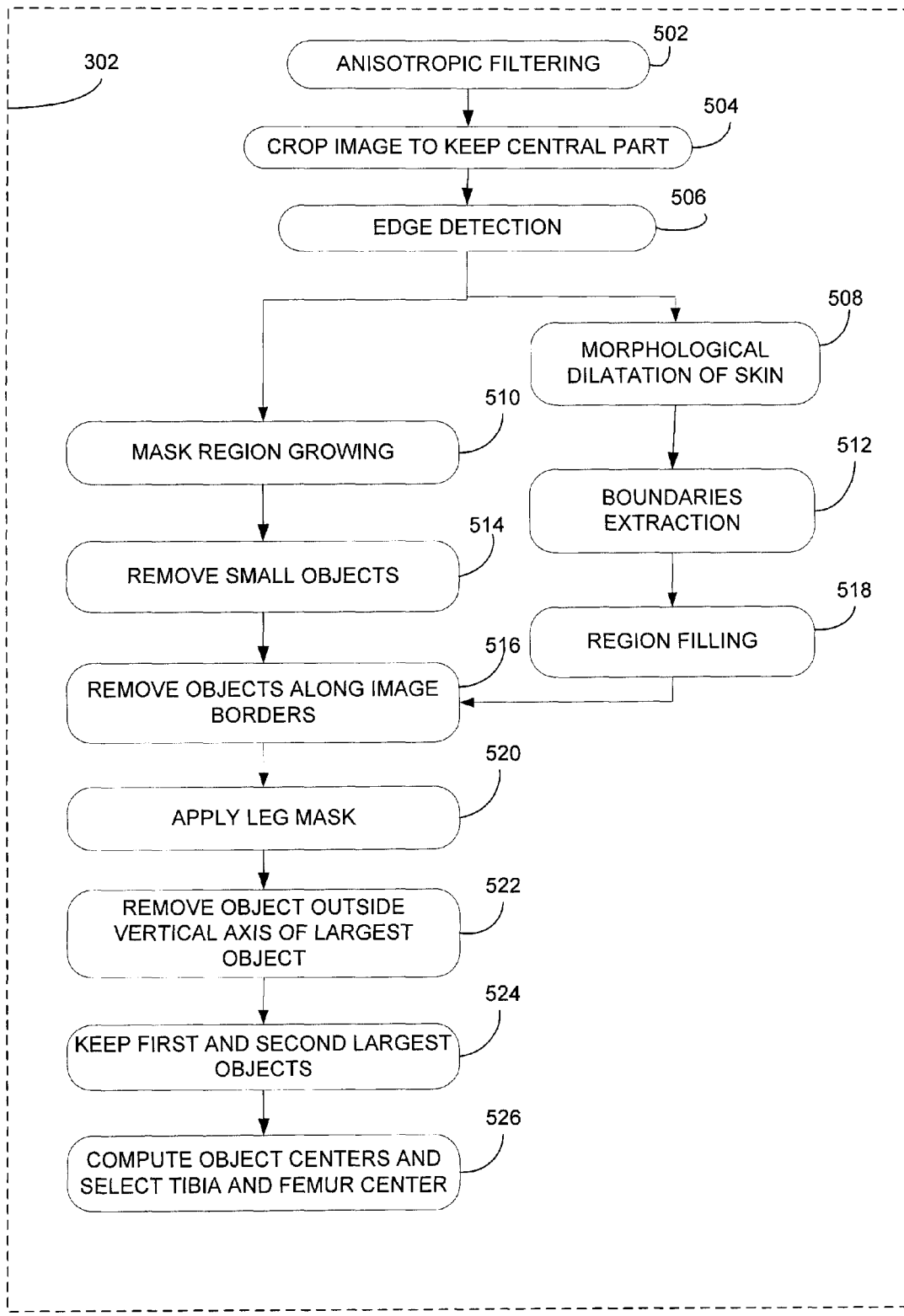
FIG. 4 is a flowchart illustrating an exemplary embodiment for computing an initial position on an image for a given structure.

FIG. 4 illustrates an exemplary embodiment for the computation of an initial position on the central image 302. The steps illustrated in FIG. 4 may be generally referred to as further processing of the acquired data using various known techniques such as filtering and edge detection. Anisotropic filtering 502, cropping of the image 504, edge detection 506, are performed to set-up the morphological dilation of skin 508 and mask region growing 510. Subsequent to edge detection 506, an edge image is obtained, in which information that may be considered of low relevance has been filtered out while preserving the important structural properties of the original image. In particular, the edge image may comprise a set of connected curves that indicate the boundaries of image structures as well as curves that correspond to discontinuities in surface orientation.

Processing of the bones and skin may be performed in parallel, as illustrated, or sequentially. When processing the skin, boundaries are extracted 512 after morphological dilatation of the skin 508. When processing the bones, once edges are detect 506, mask region growing 510 may be performed. With mask region growing 510, contours are grown from the initial point to adjacent points by applying a mask of a given size, e.g. n×n pixels. The number n of pixels of the mask may be selected so as to optimize the result achieved by the image segmentation process 100. In particular, the number n of pixels may be chosen on the basis of data found in the parameter file discussed above and may be varied in accordance with the image resolution. For instance, when it is desired for an evolving contour not to fall into holes between edges, the number n of pixels may be set in accordance with the minimal allowable size of the holes. In one embodiment, the size of the mask may be set such that the number n is greater than one (1) and particularly between ten (10) and twenty (20) pixels. Other sizes may apply. By properly setting the size of the mask used for region growing, it becomes possible to precisely tune the overall segmentation process. For example, an evolving contour can be prevented from entering within an area where adjacent structures in the image contact one another by only one (1) pixel.

Still referring to FIG. 4, various clean-up or refinement steps may then be performed including removing small objects from the image 514 and/or removing objects along image borders 516. Region filling 518 may be performed for the skin processing, and a leg mask may be applied 520 to the bone processing (when imaging a leg). The two sets of data, e.g. data for the bones and skin, are merged. Any object outside the vertical axis of the largest object may then be removed 522. For this purpose, a vertical box may be defined around the largest object in the image (e.g. around the femur bone) so as to encompass the vertical axis of the object. Objects that lie outside of the vertical box may then be removed because such objects are not of interest for segmentation. First and second largest objects, which illustratively correspond to the tibia and femur structures, are then kept 524 while the rest may be discarded. The object centers of the tibia and femur bone structures may then be computed 526. It should be understood that, depending on the structures being segmented, more than the two (2) largest objects may be kept at step 524. For instance, the third largest object, which may correspond to the patella, may also be kept. The patella center may then also be computed and selected at step 526. Also, this method may differ slightly when imaging a part of the anatomy other than a leg. Thus, any other suitable refinement steps may apply.

In some embodiments, the steps of FIG. 4 are performed only on the first or initial slice of a set of slices. As indicated above, the first or initial slice may be the center slice from a set of slices representing a volume of a body part. When computing the initial position for a subsequent slice, this may be done by radial sampling around a previous position until a first intersection with an edge occurs. A mean position of all intersection points may then act as the initial position for the structure on the new slice.

Figure 5:
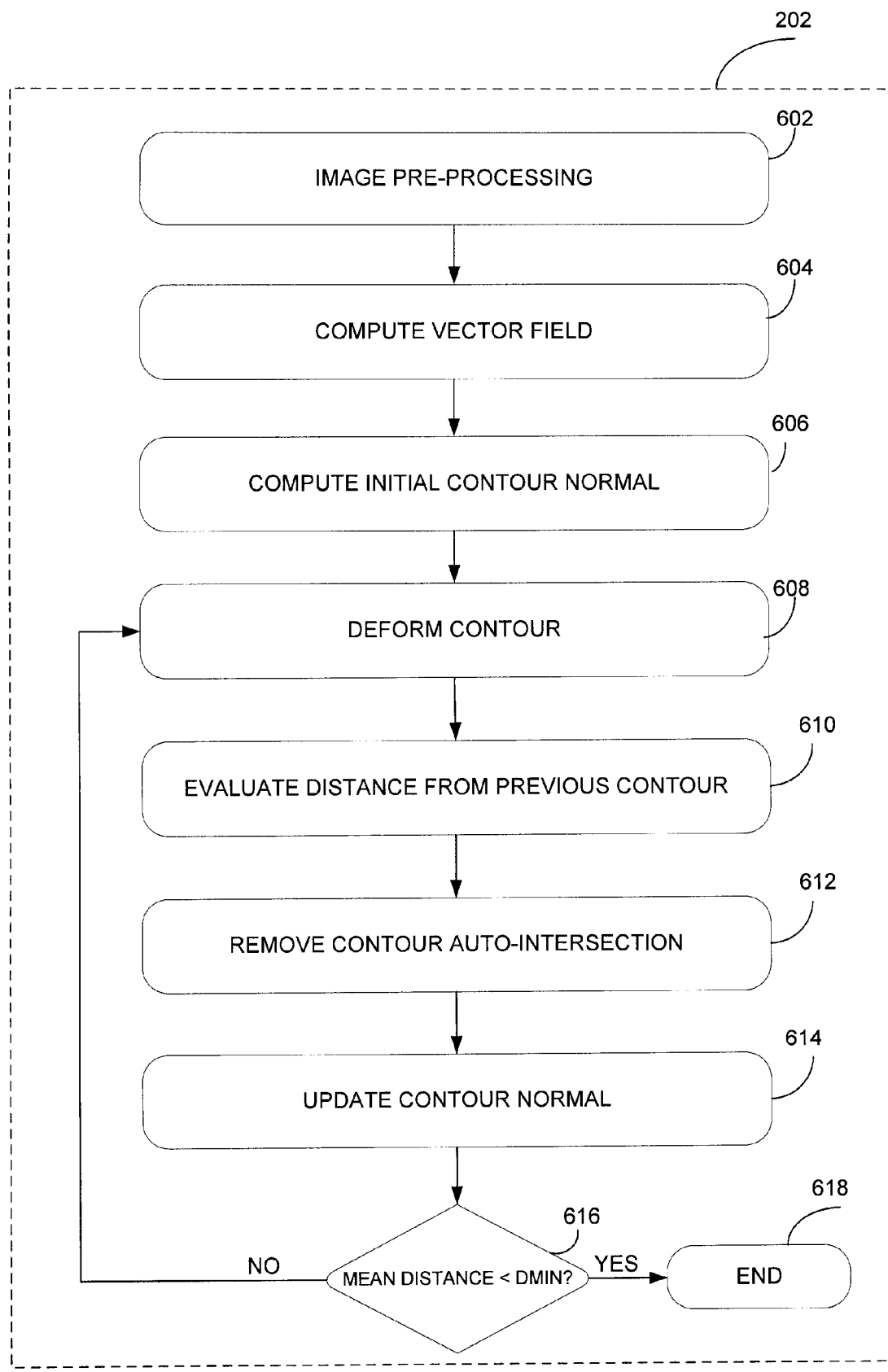
FIG. 5 is a flowchart illustrating an exemplary embodiment for performing contour definition of a structure for images taken along a given direction of the body.

FIG. 5 illustrates an exemplary embodiment for defining the contour of the structure 202 from the starting point found in step 200, for any given structure. Image pre-processing step(s) 602 may precede the subsequent steps of the method 202. Some exemplary pre-processing steps may include, but are not limited to, computing the magnitude of a gradient and clipping image intensity based on the gradient magnitude, applying an anisotropic filter and performing edge detection and edge linking, removing edges based on the mean gradient magnitude along the edge, and rebuilding the image from an edges list. Image pre-processing 602 is followed by a computation of the vector field 604. This may be done using various known methods, such as the Gradient Vector Flow (GVF) method. An initial contour normal is then computed 606 in order to perform contour deformation 608. This step may be performed iteratively as a function of a predetermined parameter.

In the embodiment illustrated, a mean distance between a current contour and a previous contour is compared to a threshold $D_{min}$ 616. The threshold value $D_{min}$ illustratively represents the tolerance on the rate of change of the contour's distance. If the mean distance exceeds the threshold value, then the contour deformation step 608 is repeated. If the mean distance is smaller than the threshold value, then it can be determined that the current contour has expanded sufficiently and closely matches the structures that were to be segmented. The deformation of the contour can therefore be stopped and the process ends 618. Other predetermined parameters, such as a variation of the mean distance on multiple iterations, may also be used to determine if the contour should be further deformed 608. When using $D_{min}$ as a parameter, the distance of the present contour from the previous contour 610 is evaluated and auto-intersections of the contour may be removed 612. The contour normal may then be updated 614 before proceeding with the comparison step 616.

Prior to proceeding with updating the contour normal 614, the size of the contours may be regularized (not shown). Indeed, once each contour has been deformed at step 608, the size of the contour, and accordingly the spacing between points thereof, increases. It is therefore desirable to adjust the size of the contour so as to harmonize the spacing between contour points. In particular, this may involve computing the distance between adjacent points on the current contour, and more particularly the distance between a point on the current contour and its closest neighbor. The computed distance may then be compared to a predetermined threshold distance, e.g. 0.5 pixels, to determine whether the computed distance is above the threshold. If this is not the case, i.e. the computed distance is below or equal to the threshold, this implies that the contour size has not changed beyond the acceptable tolerance. The next step may then be to proceed with updating the contour normal 614. Otherwise, if the computed distance is above the threshold, this implies that the size of the contour has increased beyond the acceptable tolerance and that harmonization of the contour's size is required. In order to adjust the contour size, additional points may be inserted between the adjacent contour points. Although not illustrated, it should be understood that points may also be removed between adjacent contour points if the distance between the adjacent contour points is too low compared to the threshold distance.

In one embodiment, the contour deformation step 608 is performed for a predetermined number N of iterations prior to steps 610 to 616 being performed. In this case, constraints, which, as will be discussed further below, are dynamically applied to each point along the contour for deforming the latter, are then updated after N iterations of the contour deformation step 608. In addition, after it is determined at step 616 that the mean distance is lower than the threshold value, the process 202 may only end 618 after steps 608 to 616 have been repeated for a predetermined number M of iterations.

Figure 6:
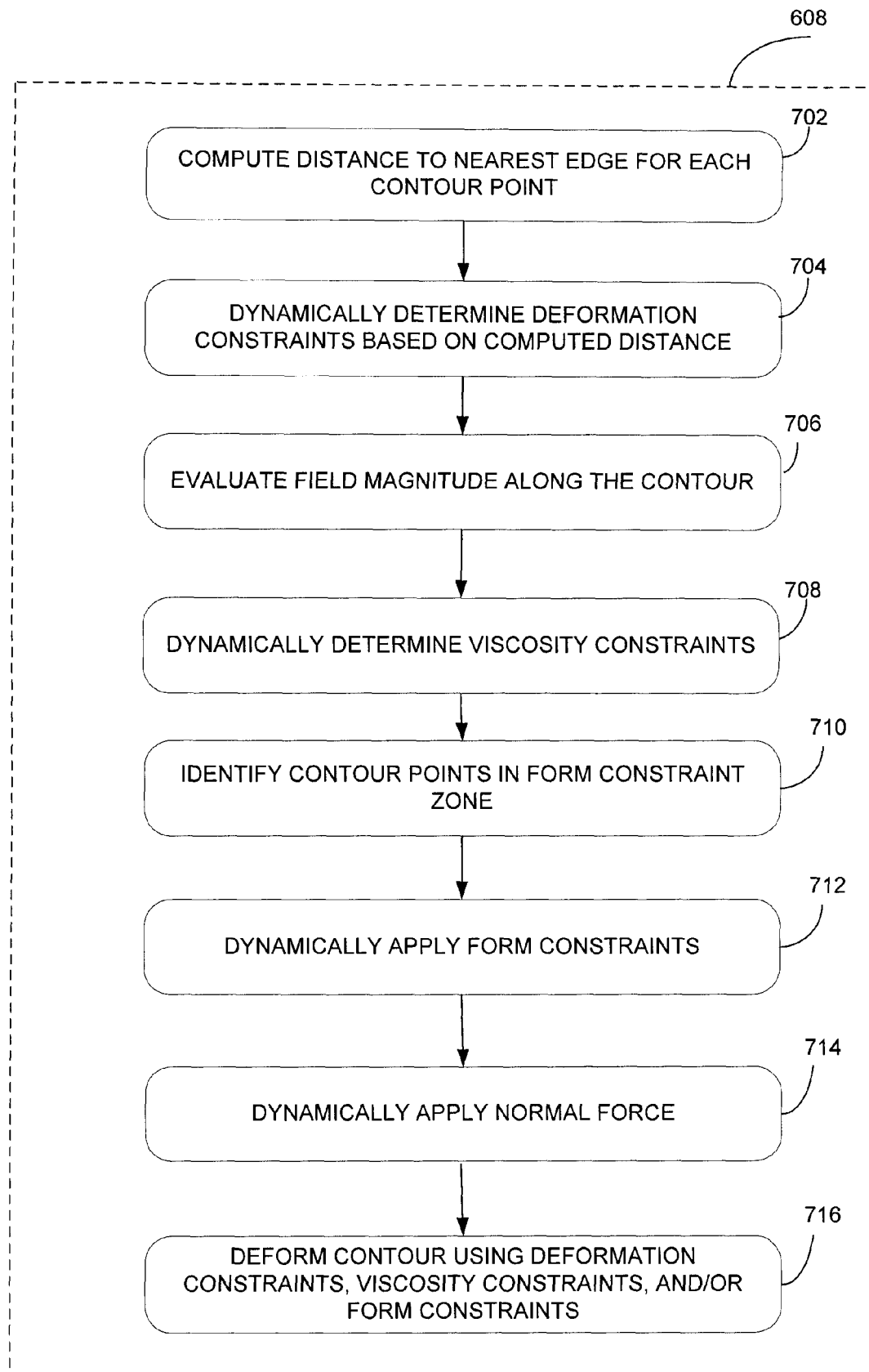
FIG. 6 is a flowchart illustrating an exemplary embodiment for deforming a contour to define a structure in the image.

Referring now to FIG. 6, there is illustrated an exemplary embodiment for performing contour deformation 608. In the embodiment illustrated, deformation is performed using a set of dynamically set constraints at each point along the contour. The constraints illustrated are deformation constraints, viscosity constraints, and/or form constraints.

Deformation constraints refer to the continuity and curvature at each point along the contour. For each point, a distance to a nearest edge is computed 702. The locally computed distances may then be used to dynamically determine the deformation constraints to be applied at each point along the contour 704, for a given iteration of contour deformation. After each iteration, at each point along the contour, the constraint may be modified independently from those of a neighboring point (or any other point along the contour) based on a newly computed distance with a nearest edge. In some embodiments, computed distances from one or more neighboring points along the contour may be taken into account when dynamically modifying the constraint for any given point. This allows the constraint to be relaxed when approaching an edge, compared to points along the contour that remain far away from edges.

The viscosity constraint refers to a parameter used to avoid having an expanding contour enter into holes between edges. This is done by setting a threshold parameter for a distance between two edges. If the distance between the edges is smaller than the threshold parameter, the contour is not allowed to enter the space during its deformation at that point. During the deformation process, the magnitude of the vector field at each point along a contour is evaluated 706. For zones where the magnitude is lower than a given parameter, spacing or distance between edges is measured and the normal force applied at those points, i.e. the force that is normal to the contour at each contour point, may be reduced in order to avoid having the contour enter a small hole between edges 708.

The form constraints refer to imposing certain constraints to pixels locally as a function of expected shapes being defined and the position of a given pixel within the expected shape. For example, if the structure being defined is a femur bone, then a point along a contour defining the bottom end of the femur may be treated differently than a point along a contour defining the top end of the femur. Since the top end is much larger, the restrictions applied to the point on the bottom end contour differ from the restrictions applied to the point on the top end contour. For example, if the structure to be segmented has the form of a vertical cylinder, as is the case of the cartilage at the top end of the femur, the form constraint may be used to reduce the displacement of the contour in the horizontal, i.e. X, direction and to force the contour to move in the vertical, i.e. Y, direction only. The form constraint may further specify that no more than 50% of the displacement of contour points is to be performed in the X direction than in the Y direction. The form constraint may therefore modify the displacement vector of the contour so as to increase or decrease the contour's displacement strength in a given direction. In order to apply form constraints, various form constraint zones are defined and contour points present in the form constraint zones are identified 710. This allows the form constraints to be applied 712 as a function of the position of the pixel and/or the form constraint zone in which it sits. Application of the form constraints may comprise applying variable forces on x and y components of a displacement vector as a function of position in the structure.

Figure 7:
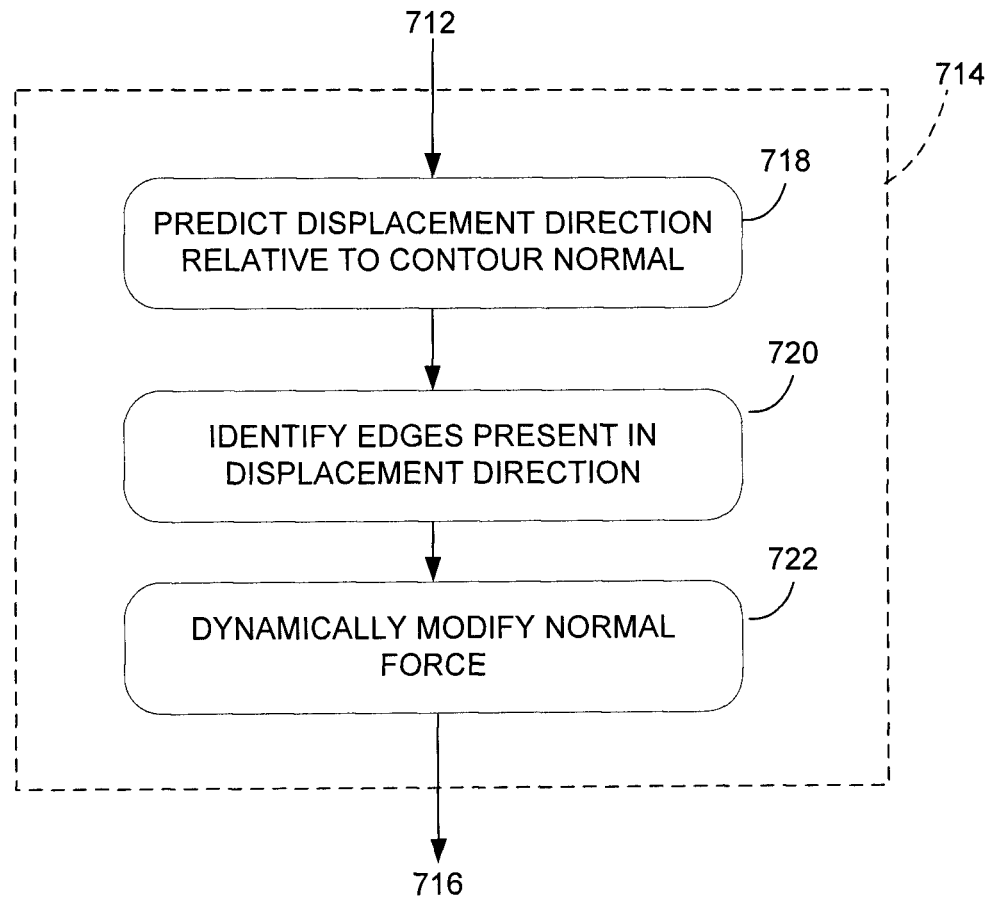
FIG. 7 is a flowchart illustrating an exemplary embodiment for dynamically applying a normal force when deforming a contour.

Referring now to FIG. 7 in addition to FIG. 6, the next step 714 may be to dynamically apply the normal force. Step 714 illustratively comprises predicting at step 718 the displacement direction of contour points relative to the contour normal. The displacement direction of each contour point is illustratively perpendicular to the contour normal at a given contour point. A displacement direction may be associated with a contour point if it is in range of gradient influence of this point. For this purpose, rays may be projected in the normal direction at point along the contour. Edges present in the displacement direction may then be identified at step 720 by determining intersection points between the projected rays and adjacent edges. It then becomes possible to discriminate between edges of interest, i.e. real edges that delineate the boundary of a structure, and noise using a priori knowledge.

The a priori knowledge may be gained from the displacement of contour points adjacent to the given contour point. During deformation of the contour, all contour points illustratively evolve towards edges in the edge image and stop once they reach an edge. The edge at which each contour point stops may either be an edge of interest, e.g. a long edge, or noise, e.g. a short and/or folded edge, as discussed above. When an edge is of interest, i.e. long, most contour points will tend to evolve towards this edge at each deformation iteration and eventually stop thereat. However, when an edge is noise, i.e. short, fewer contour points tend to evolve towards the edge and stop thereat. Using this a priori knowledge, and more particularly a relationship between each edge and contour points having knowledge thereof, e.g. contour points having evolved towards the edge, it becomes possible to discriminate between edges. Thus, step 720 can be used to forecast whether important edges are in the displacement direction. The evolving contour may then be prevented from stopping at false short edges, i.e. noise, thereby accurately expanding the contour within the structure to be segmented.

Once the displacement direction has been predicted at step 718 and edges in the displacement direction identified at step 720, the normal force may be dynamically modified at step 722. In particular, the normal force may be modified according to the distance between a point on the current contour and edges in the edge image, as computed at step 702 of FIG. 6. The normal force is indeed adjusted so that the magnitude of the displacement of the contour point is not so high that the contour, once deformed from one iteration to the next, is displaced beyond a given edge. For this purpose, the normal force may, for example, be dynamically modified so as not to apply to all contour points and/or have a maximum magnitude for all deformation iterations.

The normal force may also be adjusted to avoid having the expanding contour enter into holes between edges. This may be done using a threshold parameter for a distance between two edges, as retrieved from the parameter file discussed above. If the distance between the edges is smaller than the threshold parameter, the contour is not allowed to enter the space between the edges during its deformation at that point. During the deformation process, the magnitude of the vector field at each point along a contour is evaluated at step 604 of FIG. 5. For zones where the magnitude is lower than a given parameter, spacing or distance between edges is measured and the normal force applied at those points may be reduced in order to avoid having the contour enter a small hole between the edges.

Alternatively, holes may be detected according to the distance between each contour point and the edges, as computed at step 702 of FIG. 6. In particular, holes may be detected by identifying adjacent points on the current contour, which are close to edges. For instance, for a contour comprising fifty (50) points numbered from 1 to 50, contour points 10 to 20 may be identified as being close to a first edge and points 24 to 30 as being close to a second edge while contour points 21 to 23 are close to neither the first nor the second edge. As such, it can be determined that points 21 to 23 are positioned nearby a hole of size two (2) units between the first edge and the second edge. Having detected this hole, the current contour can be prevented from entering therein by adjusting at step 722 the normal force applied to contour points 21 to 23 accordingly. A threshold may also be associated with the size of the detected holes. In particular, gaps between edges that are lower than a predetermined threshold may be considered as holes while gaps that are above the threshold may not. For instance, the threshold may be set to a size of ten (10) points. The gap between points 21 to 23 having a size of three (3) points, which is lower than ten (10), the gap can be identified as a hole. In this embodiment, the normal force may not be used to prevent the contour from entering gaps that are under the threshold size, e.g. holes.

Referring back to FIG. 6, the deformation is finally performed 716 using all of the set parameters. In some embodiments, not all of the above-described constraints are applied. For example, the form constraints may be applied only for certain shapes, or for pixels in certain positions of certain shapes. Also for example, early iterations may use only deformation constraints while later iterations may use deformation constraints, viscosity constraints, and form constraints. This may speed up the process as the viscosity and form constraints may be less relevant, or have less of an impact, when the contour being deformed is still very small. Also alternatively, the selection of which constraints to apply may be set manually by an operator, or may be predetermined and triggered using criteria.

Figure 8A:
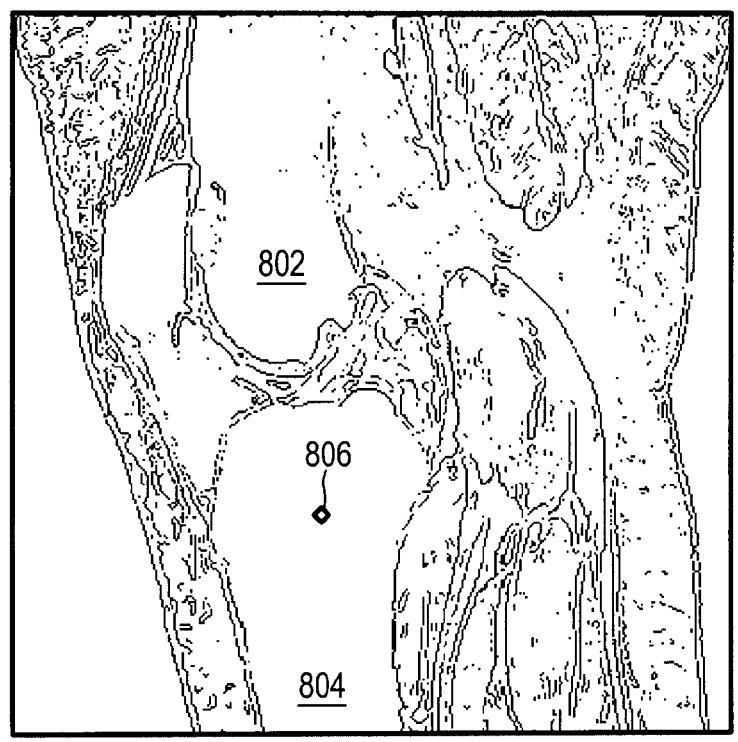
FIGS. 8a to 8f are illustrative screenshots of a contour being progressively deformed to define a tibia.
Figure 8B:
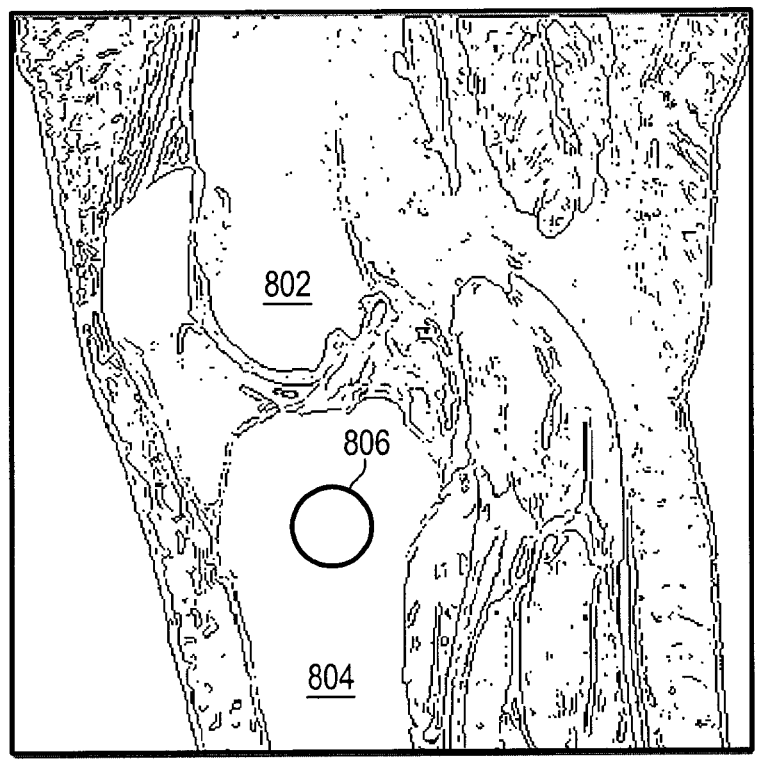
Figure 8C:
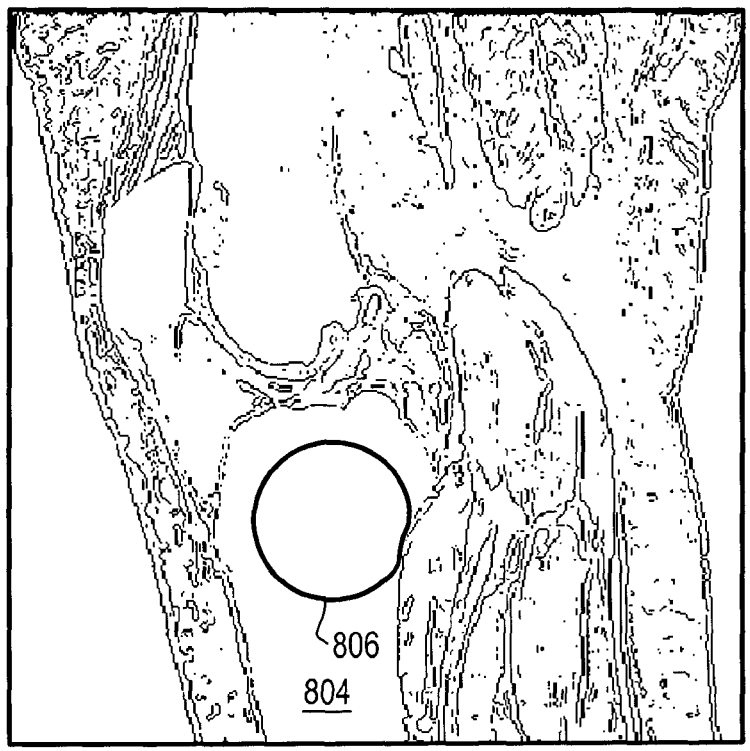
Figure 8D:
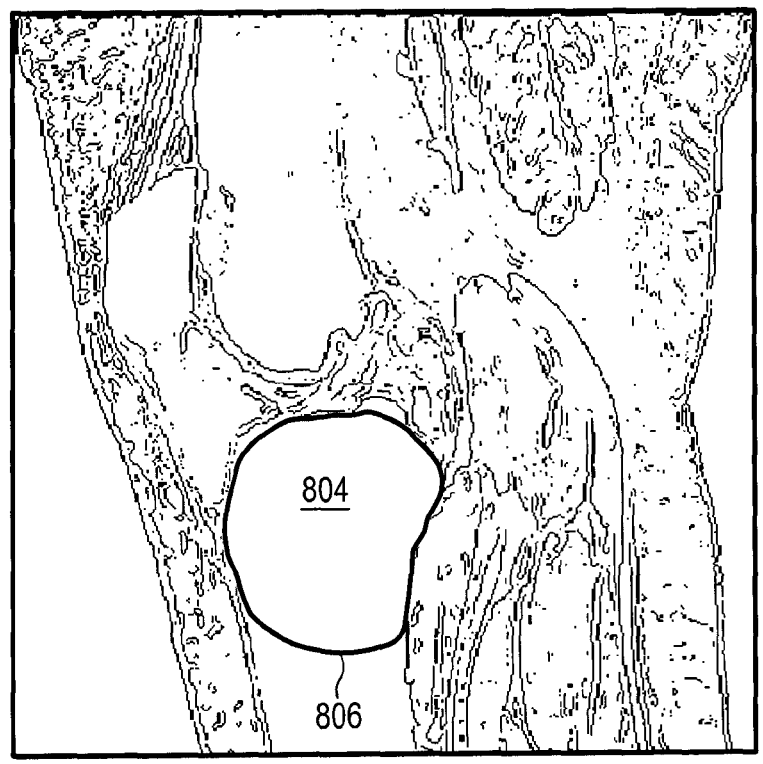
Figure 8E:
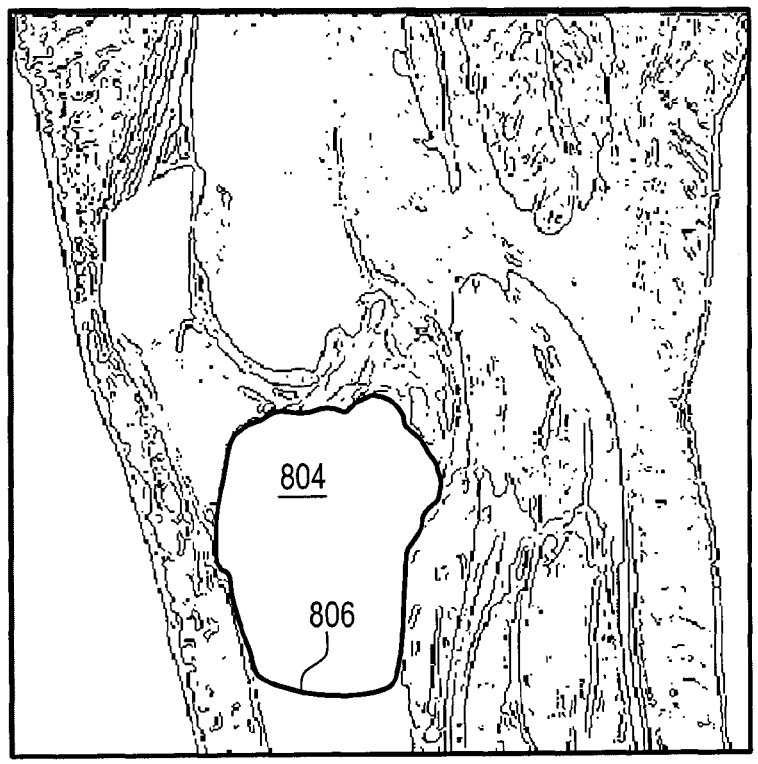
Figure 8F:
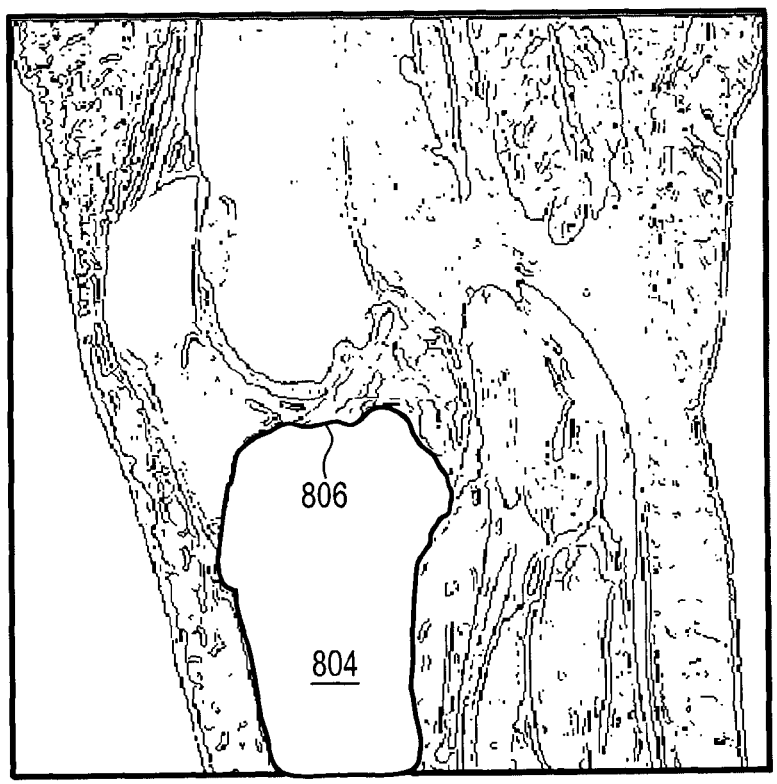

FIGS. 8*a* to 8*f* are an exemplary illustration of the deformation of a contour 806 inside of a structure 804 corresponding to a tibia. The femur 802 can also be seen in the image of a knee. In FIG. 8*a*, the contour 806 is an initial contour formed by the four neighboring pixels surrounding a starting point, as determined using the method of FIG. 4. In FIG. 8*b*, the contour 806 has been expanded one or more times from its size in FIG. 8*a*. As can be seen, the shape defined by the contour 806 in FIG. 8*b* is substantially symmetric, indicating that the constraints applied to each point along the contour have, up to this point, been substantially the same. FIGS. 8*c* and 8*d* show that the constraints applied to the points along the contour 806 have begun to change, compared to FIG. 8*b*, and be set locally as a function of various parameters at each point along the contour. With regards to FIG. 8*c*, as the contour approaches an edge on its right side but not on its left side, deformation constraints are varied. Similarly in FIG. 8*d*, only the bottom of the contour 806 is still far away from an edge and therefore, constraints for pixels along this part of the contour 806 vary from those elsewhere along the contour 806 at this stage of the deformation. FIGS. 8*e* and 8*f* illustrate the contour 806 continuing to be expanded towards the bottom of the structure at a much higher rate than in other directions. The contour 806 appears to closely match the structure 804 along the left side, right side, and top edges of the structure 804 as it continues to expand towards the bottom. Even the notch on the top right corner of the structure 804 has been snuggly fitted with the contour 806 via the deformation process.

Figure 9:
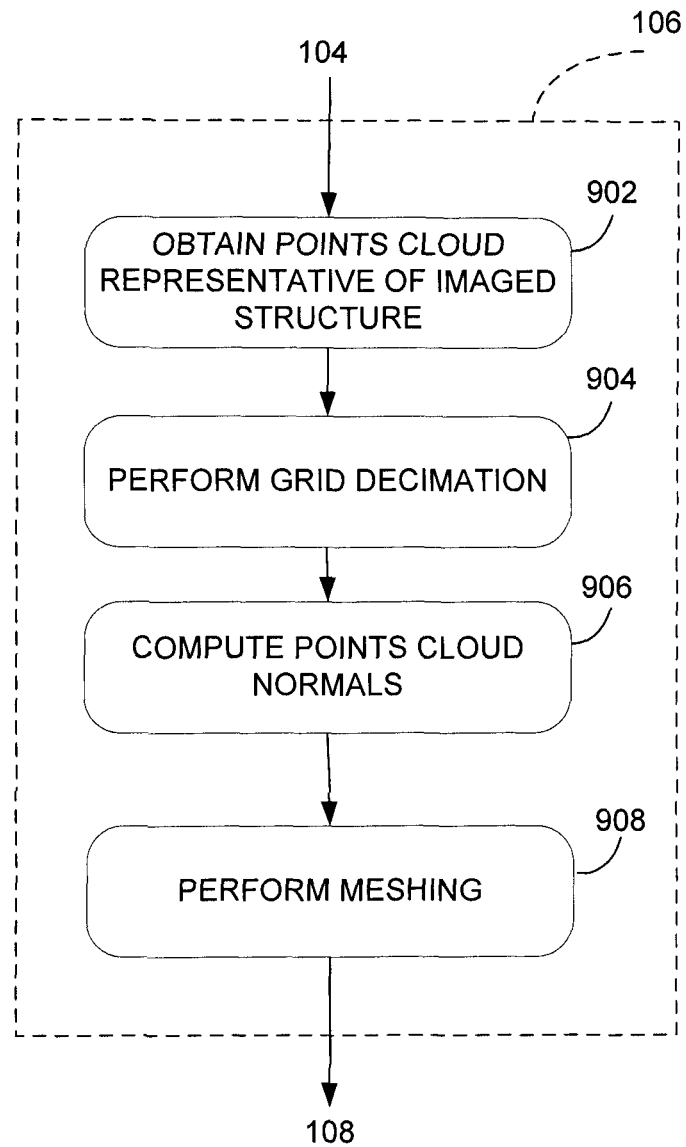
FIG. 9 is a flowchart illustrating an exemplary embodiment for meshing images.

Referring now to FIG. 9 in addition to FIG. 1, once the segmentation process 104 is completed for all images from a sequence, a points cloud may be rendered to represent the data obtained from the MRI. A meshing algorithm 106 may be applied to the rendered points cloud in order to convert the points cloud into a 3D mesh model. In particular, the step 106 of meshing images segmented along the first plane illustratively comprises obtaining the rendered points cloud at step 902. Grid decimation 904 may then be performed to reduce the number of points to be processed. For this purpose, a bounding box may be defined around the points cloud and the bounding box may be further subdivided into a plurality of cells. The size of the cells may be determined from the data found in the parameter file discussed above with reference to FIG. 1. Grid decimation may then be applied so that each cell of the bounding box comprises only a single point from the points cloud. Indeed, for each point of the points cloud, the grid decimation technique may indeed determine which cell the point belongs to. This may be done using volumetric mapping to determine the volume occupied by the cell around the point in question. Once the cell to which the selected point belongs has been determined, the next step may be to determine whether the point is the first one in the cell. This assessment can be made by determining whether the selected point has a neighbor within the cell, the selected point being identified as the first one in the cell if it has no neighbors. If the selected point is the first one in the cell, the selected point is associated with the cell. Otherwise, if the cell already comprises another point, the selected point is discarded. In this manner, it can be ensured that each one of the cells delineated by the bounding box only comprises a single point. The number of points to be processed from the points cloud data can therefore be significantly reduced. It should be understood that other decimation techniques may also apply.

Once the grid decimation has been performed at step 904, the normals of the points cloud are then computed at step 906. Any suitable technique may be used, such as approximation techniques using Delaunay balls, plane fitting, or the like. The next step may then be to performing meshing 908 using any suitable technique, such as applying a power crust algorithm, a marching cube algorithm, a Poisson algorithm, or the like. For instance, screened Poisson surface reconstruction or parallel Poisson surface reconstruction may be used. Other meshing algorithms may apply. Also, mesh models having a suitable geometry, shape, and topology, e.g. triangular, hexagonal, tetrahedron, pyramidal, or the like, may be used.

Figure 10:
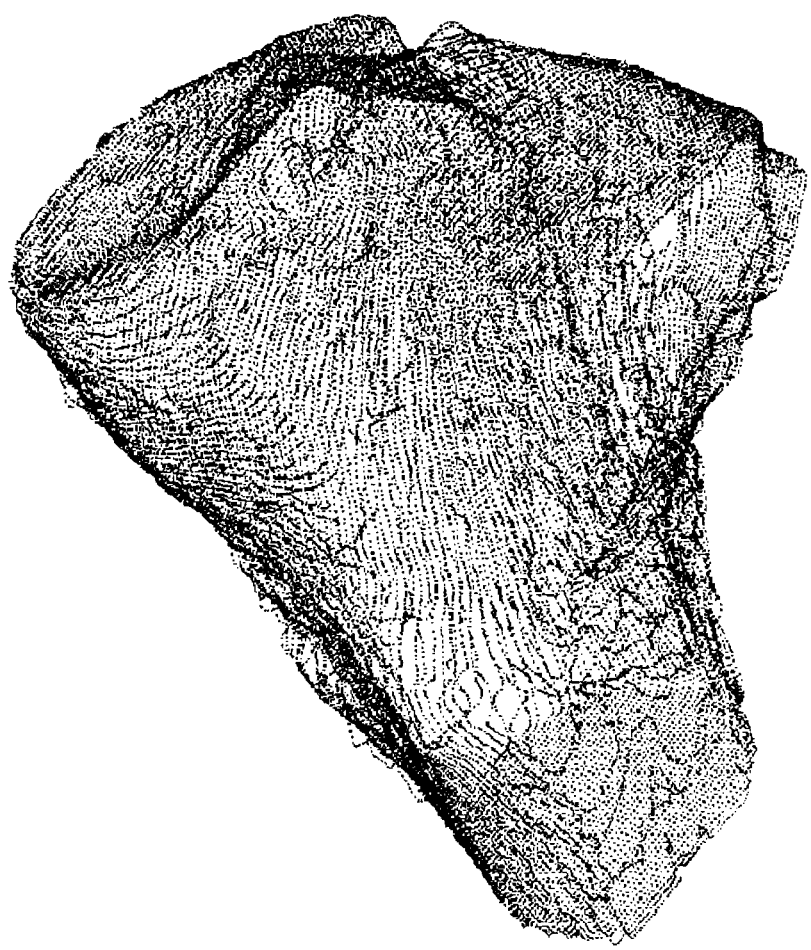
FIG. 10 is an exemplary rendered points cloud of the head of a tibia.
Figure 11A:
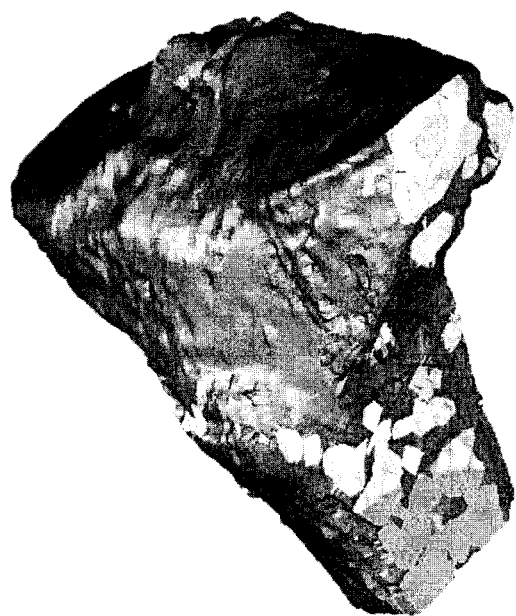
FIG. 11a is an exemplary meshed 3D model of the head of the tibia, in its raw form.
Figure 11B:
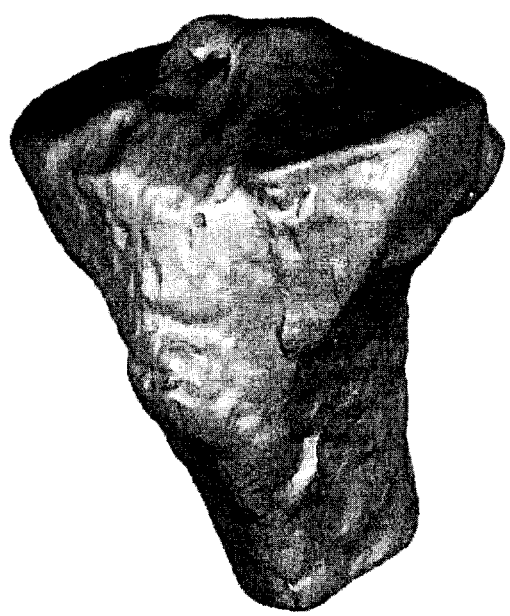
FIG. 11b is the exemplary meshed 3D model of FIG. 11a after smoothing and refinement of the model.

FIG. 10 illustrates an exemplary rendered points cloud of the head of a tibia. Various known volume rendering techniques may be used, such as volume ray casting, splatting, shear warp, and texture mapping. FIG. 11a illustrates a raw triangular mesh model. Smoothing and other refinements may be performed in order to produce the model of FIG. 11b. The meshing algorithm may be a CAD-based approach or an image-based approach. The CAD-based approach uses an intermediary step of surface reconstruction which is then followed by a traditional CAD-based meshing algorithm. The image-based approach is a more direct way as it combines the geometric detection and mesh creation stages in one process and allows a straightforward generation of meshes from the segmented 3D data. A smooth and continuous 3D model as shown in FIG. 11b may then be output at 108, as per the general process illustrated in FIG. 1. Using the first plane meshed model(s) output at 108 for each structure being segmented, segmentation of images along the second plane, e.g. the coronal plane, may then be performed at step 110.

Figure 12:
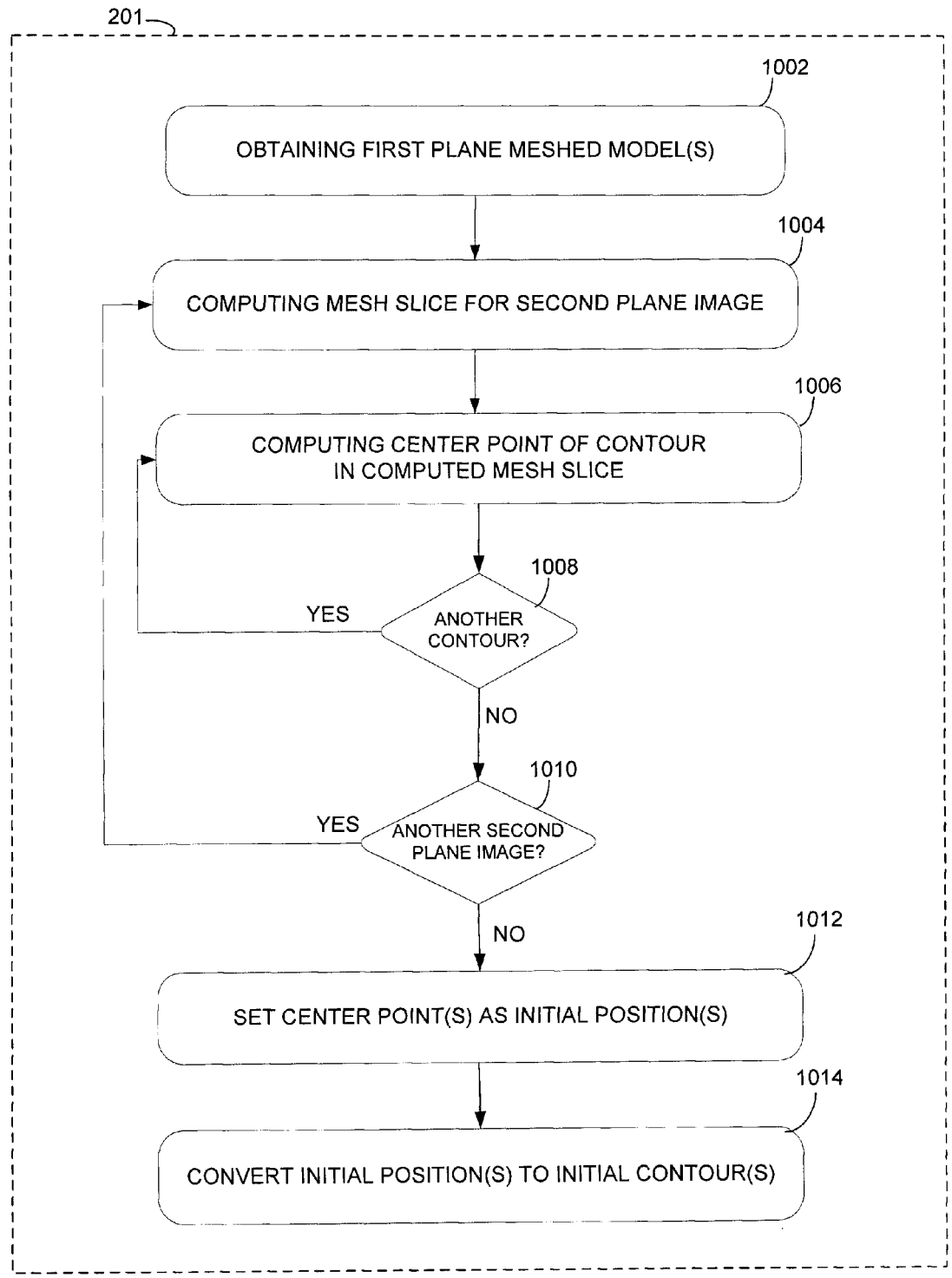
FIG. 12 is a flowchart illustrating an exemplary embodiment for setting a starting point for contour definition along a second plane when segmenting an image.

Indeed, referring back to FIG. 2, the step 110 of segmenting second plane images illustratively comprises setting 201 the starting point for contour definition of a given structure in a set of images along the second plane. Step 110 is then illustratively followed by steps similar to those discussed above with reference to step 104 of segmenting first plane images. Referring now to FIG. 12, the step 201 of setting the starting point for contour definition along the second plane illustratively comprises obtaining 1002 the first plane meshed model(s) output at step 108 of FIG. 1. The next step 1004 may then be to compute slices of the first plane meshed model(s), the mesh slices being each computed at a position of a corresponding one of the second plane images acquired at step 102 of FIG. 1. The mesh slices may be computed using any suitable technique. For instance, an algorithm that computes the intersection between a cutting plane and each polygon, e.g. triangle, of the mesh model may be used. Other techniques may apply.

Once the mesh slices have been computed, the next step 1006 may be to compute a center point of each contour found in the computed mesh slice. Once a first contour center point has been computed at step 1006, the step 1008 may be to determine whether another contour is present in the computed mesh slice. This is the case, for instance when the distal portion of the femur mesh model has been sliced, resulting in two (2) distinct contours each delineating a cross-section of the lateral and medial condyles.

If it is determined at step 1008 that another contour is present in the computed mesh slice, step 201 may flow back to the step 1006 of computing the center point of this other contour. Once it is determined at step 1008 that there are no other contours, i.e. the center points of all contours within the computed mesh slice have been computed, the next step 1010 may then be to determine whether there is another second plane image, e.g. another coronal image. If this is the case, step 201 may flow back to the step 1004 of computing a mesh slice for this other second plane image. Once it is determined at step 1010 that there are no other second plane images, the next step 1012 may then be to set the center point(s) as initial position(s), which may in turn be converted 1014 to initial contour(s).

Figure 13:
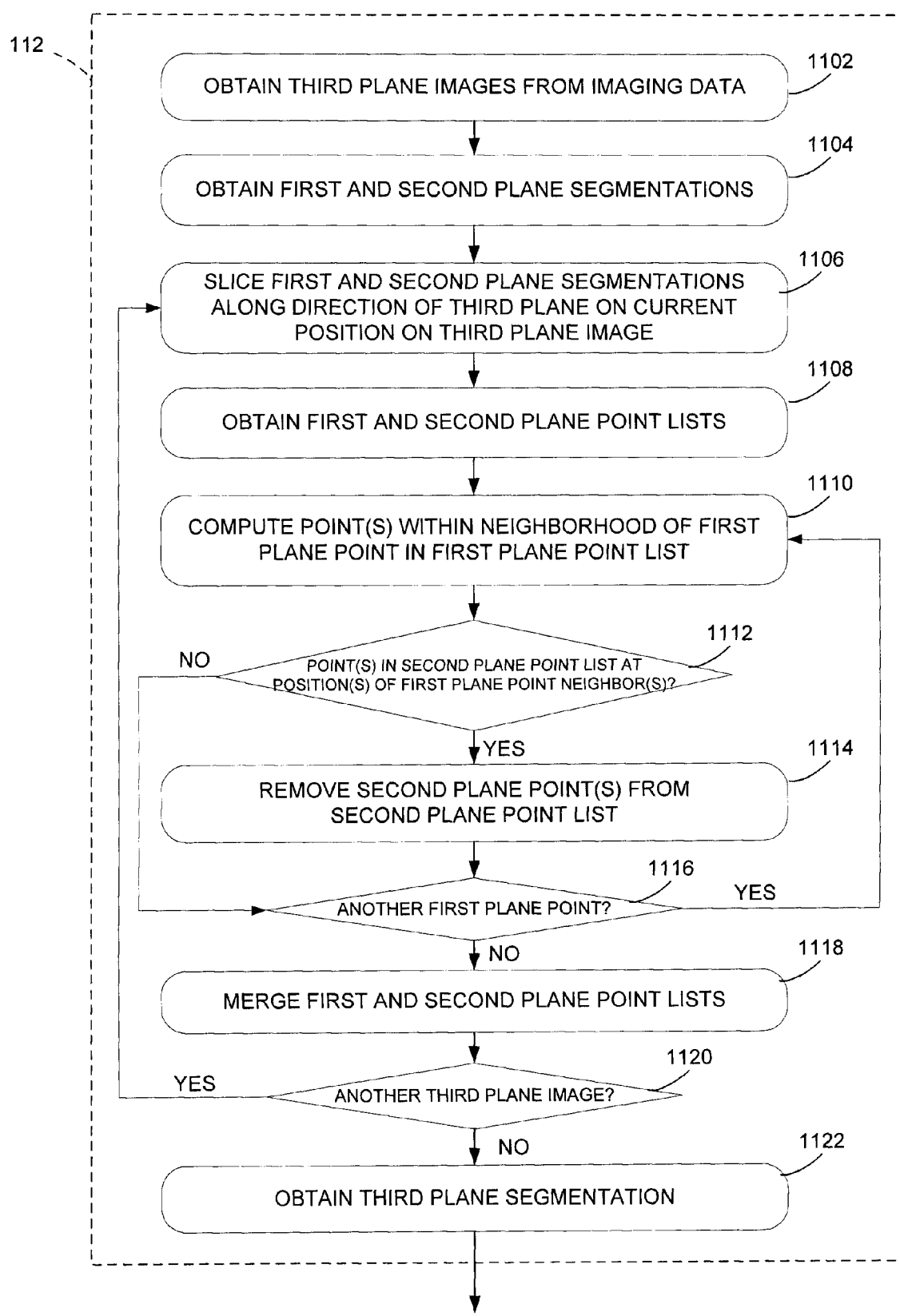
FIG. 13 is a flowchart illustrating an exemplary embodiment for merging segmentations along a first and a second plane to obtain a segmentation along a third plane.

Referring now to FIG. 13, the step 112 of merging first and second plane segmentations, e.g. sagittal and coronal segmentations, illustratively comprises obtaining at step 1102 third plane images from the imaging data acquired at step 102. This may entail slicing a volume of data, e.g. a DICOM cube, acquired at step 102. The first and second plane segmentations respectively performed at steps 104 and 110 of FIG. 1 may then be obtained at step 1104. The next step 1106 may then be to slice the first and second plane segmentations along the direction of a third plane, e.g. an axial direction, on the current position on a selected one of the third plane images. This results in first and second plane point lists being obtained at step 1108. The point(s) within the neighborhood of each point in the first plane point list may then be computed 1110. The next step 1112 may then be to assess whether there exists in the second plane point list points, which are at the same position as the neighbors of the first plane point. This would indicate a redundancy of information as the same data would be available in both the first plane segmentation and the second plane segmentation. For this purpose, accelerated tree search or any other suitable technique may be used.

If it is determined at step 1112 that one or more second plane points correspond to the first plane point neighbor(s), the identified second plane point(s) may then be removed from the second plane point list at step 1114. In this manner, information from the second plane segmentation, which is redundant and therefore not needed to complement the information from the first plane segmentation, can be eliminated. If it is determined at step 1112 that no second plane points correspond to the first plane point neighbor(s) or once redundant second plane points have been removed, the next step 1116 may be to assess whether the first plane point list comprises another first plane point. If this is the case, the step 112 then flows back to step 1110. Otherwise, the next step 1118 is to merge the first and second plane point lists. When implementing step 1118, the data remaining in the second plane point list can then be used complement the data found in the first plane point list.

The next step 1120 may then be to determine whether segmentation is to be merged for another third plane image. If this is the case, step 112 may flow back to the step 1106 of slicing the first and second plane segmentations along the third plane on the current third plane image position. Once all third plane images have been processed, the third plane segmentation is obtained at step 1122.

Figure 14:
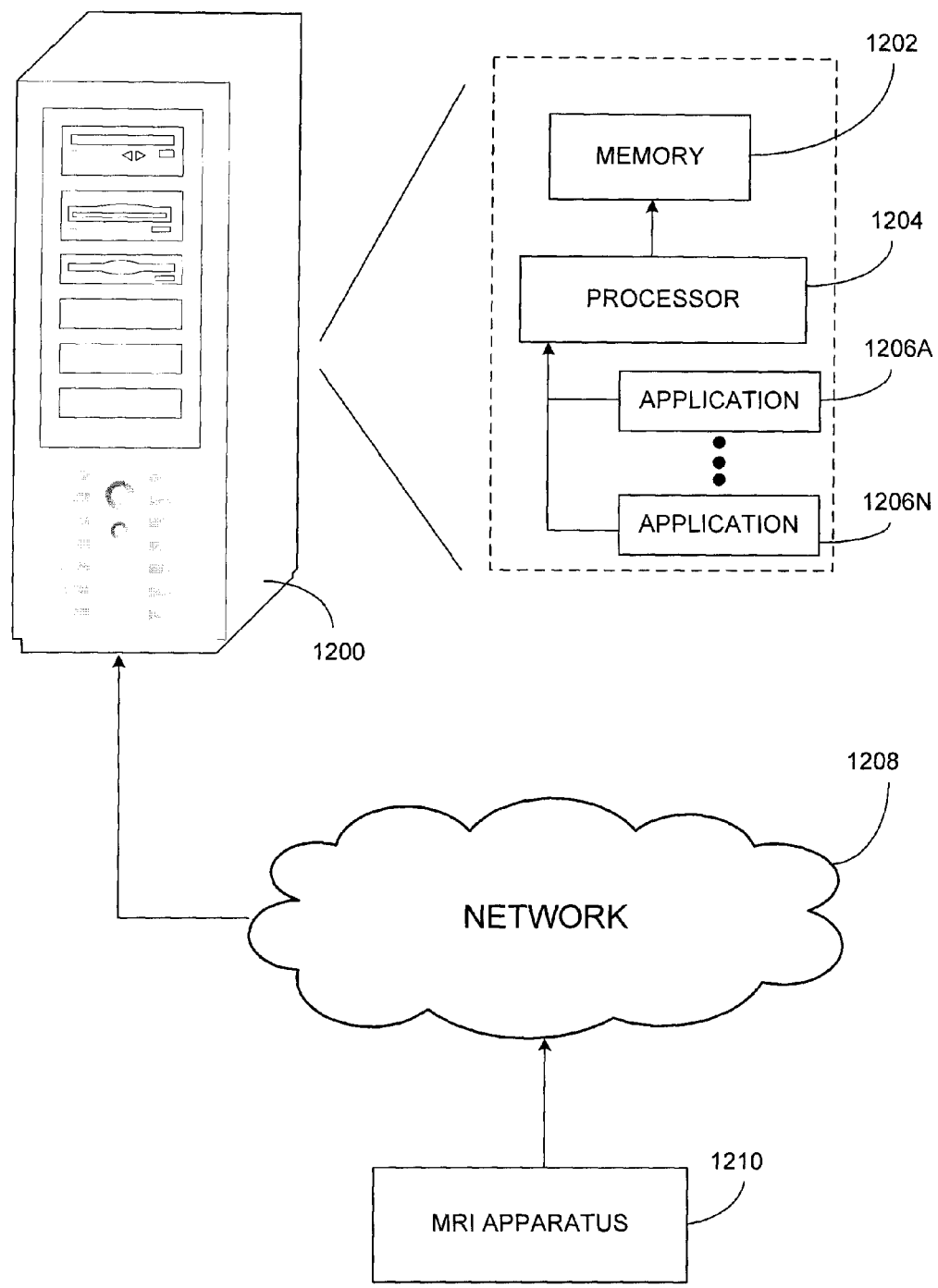
FIG. 14 is a block diagram an exemplary system for segmenting MRI data received via a network.

Referring to FIG. 14, there is illustrated a system for segmenting MRI images and generating 3D models, as described above. One or more server(s) 1200 are provided remotely and accessible via a network 1208. The server 1200 is adapted to receive imaging data from an MRI apparatus 1210, or from another computing device locally connected to the MRI apparatus, via any type of network 1208, such as the Internet, the Public Switch Telephone Network (PSTN), a cellular network, or others known to those skilled in the art.

The server 1200 comprises, amongst other things, a plurality of applications 1206a . . . 1206n running on a processor 1204, the processor being coupled to a memory 1202. It should be understood that while the applications 1206*a* . . . 1206*n* presented herein are illustrated and described as separate entities, they may be combined or separated in a variety of ways. The processor 1204 is illustratively represented as a single processor but may correspond to a multi-core processor or a plurality of processors operating in parallel.

One or more databases (not shown) may be integrated directly into memory 1202 or may be provided separately therefrom and remotely from the server 1200. In the case of a remote access to the databases, access may occur via any type of network 1208, as indicated above. The various databases described herein may be provided as collections of data or information organized for rapid search and retrieval by a computer. They are structured to facilitate storage, retrieval, modification, and deletion of data in conjunction with various data-processing operations. They may consist of a file or sets of files that can be broken down into records, each of which consists of one or more fields. Database information may be retrieved through queries using keywords and sorting commands, in order to rapidly search, rearrange, group, and select the field. The databases may be any organization of data on a data storage medium, such as one or more servers.

In one embodiment, the databases are secure web servers and Hypertext Transport Protocol Secure (HTTPS) capable of supporting Transport Layer Security (TLS), which is a protocol used for access to the data. Communications to and from the secure web servers may be secured using Secure Sockets Layer (SSL). An SSL session may be started by sending a request to the Web server with an HTTPS prefix in the URL, which causes port number "443" to be placed into the packets. Port "443" is the number assigned to the SSL application on the server. Identity verification of a user may be performed using usernames and passwords for all users. Various levels of access rights may be provided to multiple levels of users.

Alternatively, any known communication protocols that enable devices within a computer network to exchange information may be used. Examples of protocols are as follows: IP (Internet Protocol), UDP (User Datagram Protocol), TCP (Transmission Control Protocol), DHCP (Dynamic Host Configuration Protocol), HTTP (Hypertext Transfer Protocol), FTP (File Transfer Protocol), Telnet (Telnet Remote Protocol), SSH (Secure Shell Remote Protocol), POP3 (Post Office Protocol 3), SMTP (Simple Mail Transfer Protocol), IMAP (Internet Message Access Protocol), SOAP (Simple Object Access Protocol), PPP (Point-to-Point Protocol), RFB (Remote Frame buffer) Protocol.

The memory 1202 accessible by the processor 1204 receives and stores data. The memory 1202 may be a main memory, such as a high speed Random Access Memory (RAM), or an auxiliary storage unit, such as a hard disk, flash memory, or a magnetic tape drive. The memory 1202 may be any other type of memory, such as a Read-Only Memory (ROM), Erasable Programmable Read-Only Memory (EPROM), or optical storage media such as a videodisc and a compact disc.

The processor 1204 may access the memory 1202 to retrieve data. The processor 1204 may be any device that can perform operations on data. Examples are a central processing unit (CPU), a front-end processor, a microprocessor, a graphics processing unit (GPUNPU), a physics processing unit (PPU), a digital signal processor, and a network processor. The applications 1206*a* . . . 1206*n* are coupled to the processor 1204 and configured to perform various tasks as explained below in more detail. An output may be transmitted to an output device (not shown) or to another computing device via the network 1208.

Figure 15:
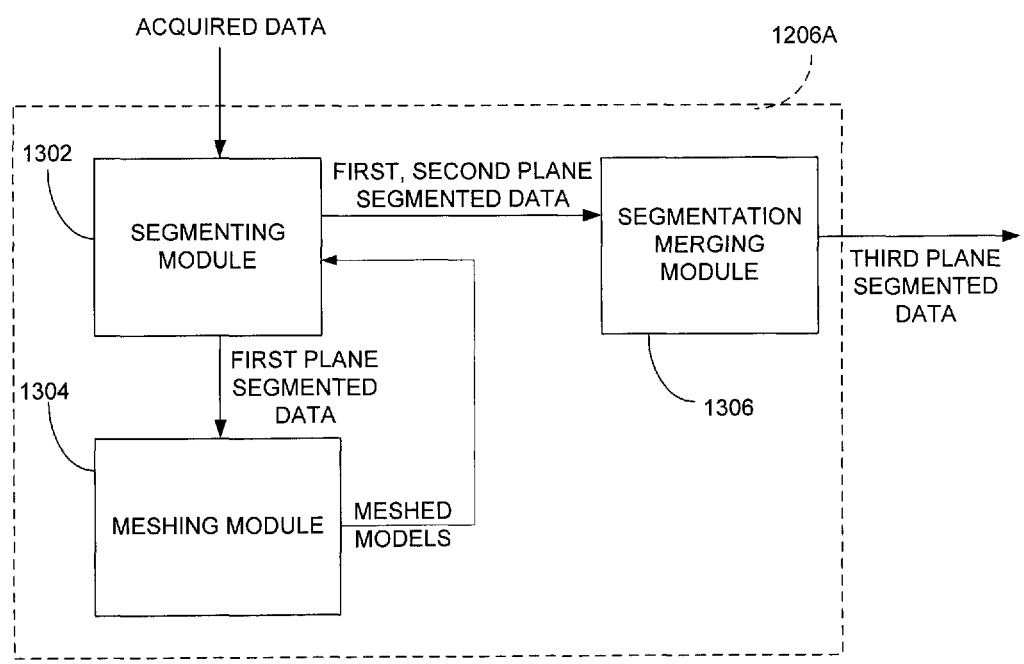
FIG. 15 is a block diagram showing an exemplary application running on the processor of FIG. 14, for segmenting the MRI data.

FIG. 15 illustrates an exemplary application 1206*a* running on the processor 1204. The application 1206*a* comprises at least segmenting module 1302, a meshing module 1304, and a segmentation merging module 1306. These modules interact together in order to provide the 3D models from the segmented data. The acquired data is received by the segmenting module 1302 and processed in accordance with the flowcharts of FIGS. 2 to 7, 9, 12, and 13 in order to generate segmented data. First plane segmented data is transmitted to the meshing module 1304 for further processing. The meshing algorithms are applied by the meshing module 1304 to produce a smooth and continuous 3D model, as illustrated in FIG. 10*b*. The meshed models are then output by the meshing module 1304 to the segmenting module 1302, which generates therefrom a second plane segmented data, as discussed above with reference to FIG. 1, FIG. 2, and FIG. 12. The segmenting module 1302 then outputs the first and second plane segmented data to the segmentation merging module 1306, which generates from the received data third plane segmented data, as discussed above with reference to FIG. 13.

Figure 16:
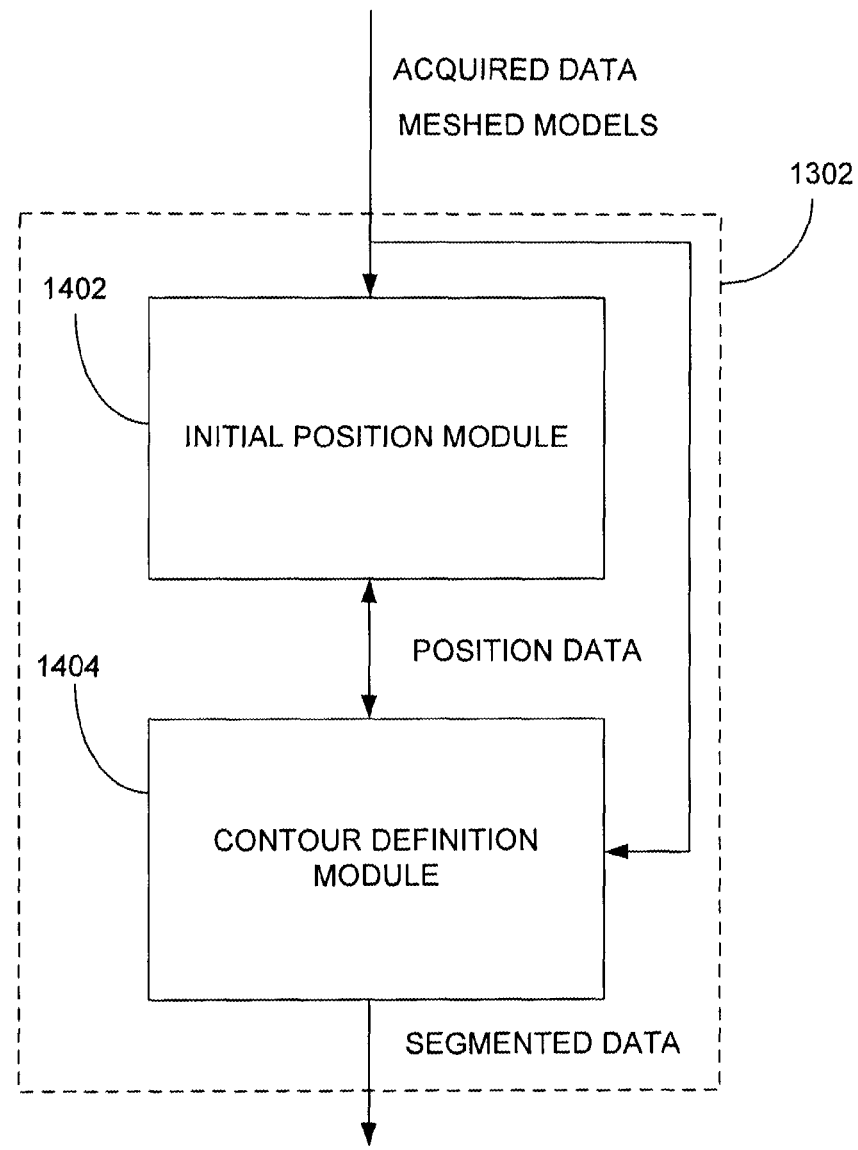
FIG. 16 is a block diagram showing an exemplary segmenting module from FIG. 15.

FIG. 16 illustrates an exemplary embodiment of the segmenting module 1302, whereby the acquired data and/or the meshed model data is first run through an initial position module 1402 in accordance with the steps of FIGS. 3*a*, 3*b*, 4, and 12. Position data is exchanged between the initial position module 1402 and a contour definition module 1404, whereby the steps of FIGS. 5 to 7 are applied to the acquired data. As per the illustrated embodiment, the acquired data may be provided directly to both the initial position module 1402 and the contour definition module 1404 in order to facilitate parallel processing and simplify the data exchanged between the initial position module 1402 and the contour definition module 1402. Segmented data is output from the contour definition module 1404.

Figure 17:
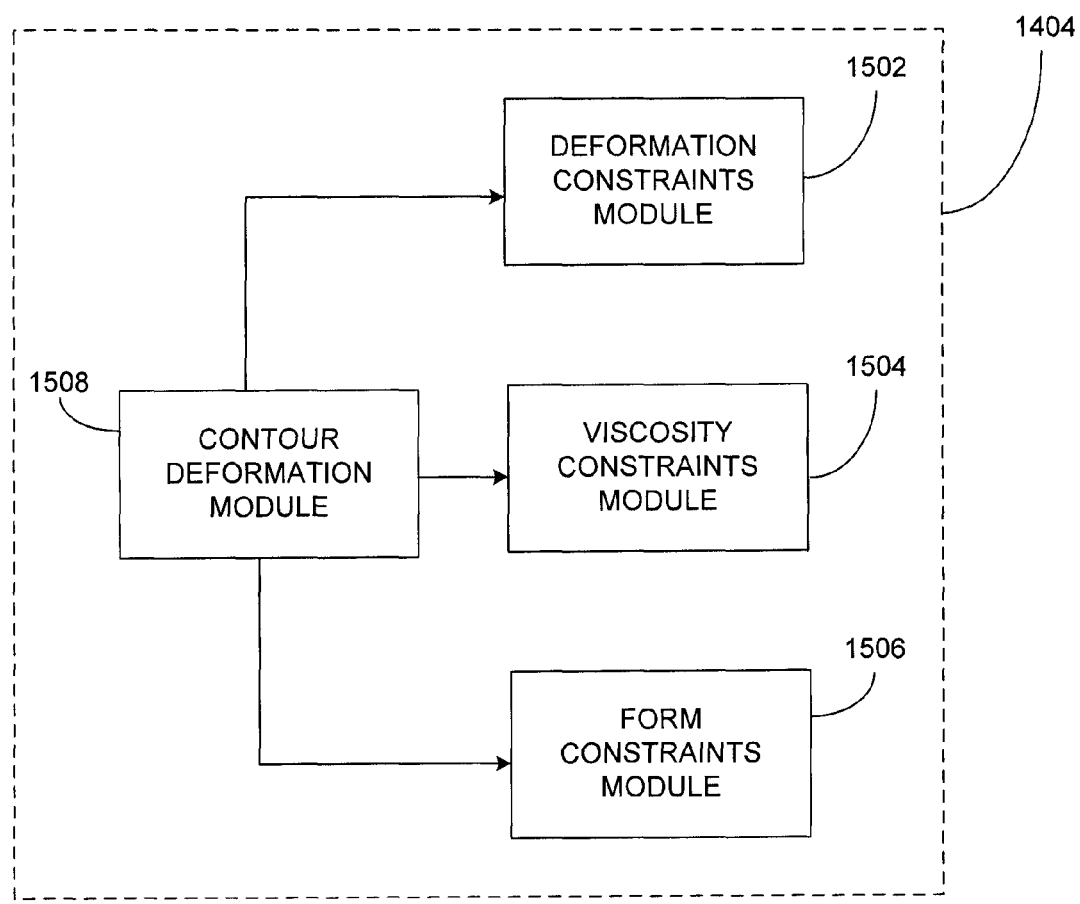
FIG. 17 is a block diagram showing an exemplary contour definition module from FIG. 16.

FIG. 17 is an exemplary embodiment of the contour definition module 1404. A contour deformation module 1508 interacts with a deformation constraints module 1502, a viscosity constraints module 1504, and a form constraints module 1506. Each one of the deformation constraints module 1502, the viscosity constraints module 1504, and the form constraints module 1506 may access the memory 1202 in order to retrieve previously stored data, such as initial contours, edge lists, contour Normals, vector fields, threshold information, etc. For example, the deformation constraints module 1502 may generate a dynamic matrix for continuity and curvature based on measured distances between contour points and a nearest edge. The dynamic matrix may be updated upon receipt of new information from the contour deformation module 1508 or by accessing the memory 1202. In another example, the viscosity constraints module 1504 uses stored vector fields to evaluate field magnitudes at each point along a contour, and then selectively applies a force at each point along the contour as a function of the field magnitudes. Various embodiments for implementing the steps of FIGS. 6 and 7 using the contour definition module 1404 of FIG. 17 will be readily understood by those skilled in the art.

While illustrated in the block diagrams as groups of discrete components communicating with each other via distinct data signal connections, it will be understood by those skilled in the art that the present embodiments are provided by a combination of hardware and software components, with some components being implemented by a given function or operation of a hardware or software system, and many of the data paths illustrated being implemented by data communication within a computer application or operating system. The structure illustrated is thus provided for efficiency of teaching the present embodiment.

It should be noted that the present invention can be carried out as a method, can be embodied in a system, and/or on a computer readable medium. The embodiments of the invention described above are intended to be exemplary only. The scope of the invention is therefore intended to be limited solely by the scope of the appended claims.

The invention claimed is:

1. A computer-implemented method for segmenting magnetic resonance imaging (MRI) data, the method comprising:
    detecting one or more edges in an image for a given bone structure;
    determining an initial position on the image;
    converting the initial position into an initial contour within the given bone structure; and
    iteratively deforming the initial contour to expand into a shape matching the given bone structure by dynamically applying a set of constraints locally to each point along the initial contour for causing each point to evolve towards at least a selected one of the one or more edges, and updating the set of constraints after one or more iterations, wherein the set of constraints includes curvature and continuity constraints, and wherein iteratively deforming the initial contour comprises computing a distance from each point along the initial contour to a nearest one of the one or more edges present in the image and dynamically determining from the computed distance the curvature and continuity constraints to be applied at the point.

2. The method of claim 1, wherein determining the initial position, converting the initial position into the initial contour, and iteratively deforming the initial contour are performed for a plurality of images for the given bone structure, the plurality of images processed at least one of sequentially and in parallel.

3. The method of claim 1, wherein iteratively deforming the initial contour comprises performing a first contour definition of the given bone structure along a first direction followed by a second contour definition of the given bone structure along a second direction, and merging the first and second contour definitions such that data from the second contour definition complements data from the first contour definition.

4. The method of claim 3, further comprising obtaining a points cloud representative of the first contour definition, converting the points cloud into a mesh model, obtaining a plurality of slices of the mesh model along the second direction, and performing the second contour definition on the basis of the mesh slices.

5. The method of claim 4, wherein the first contour definition is performed along a sagittal plane and the second contour definition is performed along a coronal plane.

6. The method of claim 4, wherein converting the points cloud into a mesh model comprises performing a grid decimation on the points cloud for reducing a number of points to be processed from the points cloud.

7. The method of claim 1, further comprising computing a mean distance between a current contour and a previous contour and comparing the mean distance to a threshold distance, wherein the initial contour is iteratively deformed until the mean distance is below the threshold distance.

8. The method of claim 1, wherein iteratively deforming the initial contour comprises evaluating a magnitude of a vector field at each point along the initial contour and dynamically determining from the magnitude one or more viscosity constraints to be applied at the point for preventing the expanding initial contour from entering into holes defined between the one or more edges in the image.

9. The method of claim 1, wherein iteratively deforming the initial contour comprises defining one or more form constraint zones in the image and dynamically modifying a displacement vector at each point along the initial contour in accordance with at least one of a form constraint zone the point belongs to and a position of the point within the given bone structure.

10. The method of claim 1, wherein iteratively deforming the initial contour comprises predicting a displacement direction at each point along the initial contour relative to a normal to the initial contour, identifying ones of the one or more edges present in the predicted displacement direction, and dynamically modifying a normal force applied to each point along the initial contour in accordance with the ones of the one or more edges identified in the predicted displacement direction.

11. A system for generating segmented data from magnetic resonance imaging (MRI) data, the system comprising:
    at least one computer server communicable with at least one computing device over a network, the at least one computer server having a processor and a memory;
    an initial position module stored on the memory and executable by the processor, the initial position module having program code that when executed, determines an initial position on an image for a given bone structure and converting the initial position into an initial contour; and
    a contour definition module stored on the memory and executable by the processor, the contour definition module having program code that when executed, iteratively deforms the initial contour to expand into a shape matching the given bone structure by dynamically applying a set of constraints locally to each point along the initial contour for causing each point to evolve towards at least a selected one of one or more edges present in the image, and updating the set of constraints after one or more iterations, wherein the set of constraints includes curvature and continuity constraints, and wherein iteratively deforming the initial contour comprises computing a distance from each point along the initial contour to a nearest one of the one or more edges present in the image and dynamically determining from the computed distance the curvature and continuity constraints to be applied at the point.

12. The system of claim 11, wherein the contour definition module has program code that when executed performs a first contour definition of the given bone structure along a first direction followed by a second contour definition of the given bone structure along a second direction.

13. The system of claim 12, further comprising a meshing module stored on the memory and executable by the processor, wherein the contour definition module has program code that when executed obtains a points cloud representative of the first contour definition and further wherein the meshing module has program code that when executed converts the points cloud into a mesh model.

14. The system of claim 13, further comprising a segmentation merging module stored on the memory and executable by the processor, wherein the contour definition module has program code that when executed performs the second contour definition on the basis of the mesh model and the segmentation merging module has program code that when executed merges the first and second contour definitions such that data from the second contour definition complements data from the first contour definition.

15. The system of claim 14, wherein the meshing module has program code that when executed performs a grid decimation on the points cloud to reduce a number of points to be processed when converting the points cloud into the mesh model.

16. The system of claim 11, wherein the contour definition module comprises a viscosity constraints module having program code that when executed evaluates a magnitude of a vector field at each point along the initial contour and dynamically determines from the magnitude one or more viscosity constraints to be applied at the point for preventing the expanding initial contour from entering into holes defined between the one or more edges in the image.

17. The system of claim 11, wherein the contour definition module comprises a form constraints module having program code that when executed defines one or more form constraint zones in the image and dynamically modifies a displacement vector at each point along the initial contour in accordance with at least one of a form constraint zone the point belongs to and a position of the point within the given bone structure.

18. The system of claim 11, wherein the contour definition module has program code that when executed predicts a displacement direction at each point along the initial contour relative to a normal to the initial contour, identifies ones of the one or more edges present in the predicted displacement direction, and dynamically modifies a normal force applied to each point along the initial contour in accordance with the ones of the one or more edges identified in the predicted displacement direction.

19. A non-transitory computer readable medium having stored thereon program code executable by a processor for generating segmented data from magnetic resonance imaging (MRI) data, the program code executable for:
- determining an initial position on an image for a given bone structure;
- converting the initial position into an initial contour within the given bone structure; and
- iteratively deforming the initial contour to expand into a shape matching the given bone structure by dynamically applying a set of constraints locally to each point along the initial contour for causing each point to evolve towards at least a selected one of one or more edges present in the image, and updating the set of constraints after one or more iterations,
- wherein the set of constraints includes curvature and continuity constraints, and wherein iteratively deforming the initial contour comprises computing a distance from each point along the initial contour to a nearest one of the one or more edges present in the image and dynamically determining from the computed distance the curvature and continuity constraints to be applied at the point.

* * * * *